(12) United States Patent
Inoue et al.

(10) Patent No.: US 7,102,207 B2
(45) Date of Patent: Sep. 5, 2006

(54) SEMICONDUCTOR DEVICE HAVING RECTIFYING ACTION

(75) Inventors: Tomoki Inoue, Tokyo (JP); Koichi Sugiyama, Saitama (JP); Hideaiki Ninomiya, Kanagawa (JP); Tsuneo Ogura, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 25 days.

(21) Appl. No.: 10/406,386

(22) Filed: Apr. 4, 2003

(65) Prior Publication Data
US 2005/0073030 A1   Apr. 7, 2005

(30) Foreign Application Priority Data
Dec. 3, 2002 (JP) ............................. P2002-351374

(51) Int. Cl.
  *H01L 31/075* (2006.01)
  *H01L 27/095* (2006.01)
(52) U.S. Cl. ................... 257/656; 257/476; 257/483
(58) Field of Classification Search ............... 257/330, 257/471, 476, 483, 484, 655, 656
  See application file for complete search history.

(56) References Cited

U.S. PATENT DOCUMENTS 5,177,572 A * 1/1993 Murakami ................. 257/260
5,693,569 A * 12/1997 Ueno ........................ 438/270
5,917,216 A * 6/1999 Floyd et al. ................ 257/330
6,078,090 A * 6/2000 Williams et al. ........... 257/476

FOREIGN PATENT DOCUMENTS

| JP | 7-273354    | 10/1995 |
| JP | 10-163469   | 6/1998  |
| JP | 10-261791   | 9/1998  |
| JP | 11-26779    | 1/1999  |
| JP | 2000-323488 | 11/2000 |
| JP | 2001-36069  | 2/2001  |

* cited by examiner

*Primary Examiner*—Ori Nadav
(74) *Attorney, Agent, or Firm*—Oblon, Spivak, McClelland, Maier & Neustadt, P.C.

(57) ABSTRACT

A semiconductor device including a base layer of a first conductivity type having a first main surface and a second main surface opposite the first main surface, a first main electrode layer connected to the first main surface, control regions arranged inside grooves penetrating the first main electrode layer and reach inside the base layer, and a second main electrode layer of the first conductivity type and connected to the second main surface.

3 Claims, 32 Drawing Sheets

SEMICONDUCTOR DEVICE HAVING RECTIFYING ACTION

CROSS REFERENCE TO RELATED APPLICATIONS

This application is based upon and claims the benefit of priority from the prior Japanese Patent Application No. 2002-351374 filed on Dec. 3, 2002; the entire contents of which are incorporated herein by reference.

BACKGROUND OF THE INVENTION

1. Field of the Invention

The present invention relates to a semiconductor device. More specifically, the present invention relates to a semiconductor device having a pin structure wherein a semiconductor region having a low impurity concentration is arranged between a p-type semiconductor region and an n-type semiconductor region.

2. Description of Related Art

A PiN diode is generally employed as a semiconductor power device having a high reverse blocking voltage. As is shown in FIG. 1, a PiN diode has an $n^-$-type base layer 101, a p-type emitter region 103 connected to one of the main surfaces of the $n^-$-type base layer 101, an $n^+$-type emitter region 107 connected to the other opposite main surface, an anode electrode 108 connected to the p-type emitter region 103, and a cathode electrode 109 connected to the $n^+$-type emitter region 107.

A positive voltage, relative to the cathode electrode 109, is applied to the anode electrode 108. Holes are injected from the p-type emitter region 103 to the $n^-$-type base layer 101, and in accordance with the amount of injected holes, electrons are injected from the $n^+$-type emitter region 107 to the $n^-$-type base layer 101. The holes and electrons (hereinafter referred to as "carriers") are accumulated in the $n^-$-type base layer 101, and the resistance of the $n^-$-type base layer 101 is reduced. The diode is then rendered conductive, and a current flows from the anode electrode 108 to the cathode electrode 109.

When a voltage applied in the conductive state is inverted, the carriers accumulated in the $n^-$-type base layer 101 are discharged, and a depletion layer starts to spread, beginning at the pn junction between the $n^-$-type base layer 101 and the p-type emitter region 103. As a result, the diode falls into a blocking state.

A PiN diode according to related art may further include an n-type or $n^+$-type semiconductor region arranged between the $n^-$-type base layer 101 and the p-type emitter region 103, and implements a soft recovery characteristic for a reverse recovery.

A PiN diode according to other related art further includes an embedded control electrode that reaches inside the $n^-$-type base layer 101, so that the efficiency of the injection of carriers is improved and a voltage in the forward direction in the conductive state is reduced.

Since a switching frequency was required to be increased recently according to the demand that the efficiency of an inverter, for example, should be improved, a reverse recovery loss for the diode must be reduced. In order to reduce the reverse recovery loss, the amount of the carriers accumulated in the $n^-$-type base layer 101 needs to be reduced. To reduce the amount of the carriers, only the impurity concentration of the p-type emitter region 103 needs to be lowered. However, to maintain low contact resistance between the p-type emitter region 103 and the anode region 108, the impurity concentration on the contact surface of the p-type emitter region 103 can not be reduced. Therefore, any reduction in the impurity concentration of the p-type emitter region 103 is limited and thus, a reduction in the reverse recovery loss of the diode has been limited so far.

In addition, once the impurity concentration of the p-type emitter region 103 is reduced, the number of the carriers accumulated in the $n^-$type base layer 101 is reduced when driven by a small current. Therefore, at the time of the reverse recovery, the depletion layer spreads quickly, and the voltage rising rate is increased. This high voltage rising rate causes the breakdown voltage of the load to deteriorate.

SUMMARY OF THE INVENTION

An aspect of the present invention provides a semiconductor device including a base layer of a first conductivity type having a first main surface and a second main surface opposite the first main surface, a first main electrode layer connected to the first main surface, control regions arranged inside grooves penetrating the first main electrode layer and reach inside the base layer, and a second main electrode layer of the first conductivity type and connected to the second main surface.

DETAILED DESCRIPTION OF EMBODIMENTS

Figure 1:
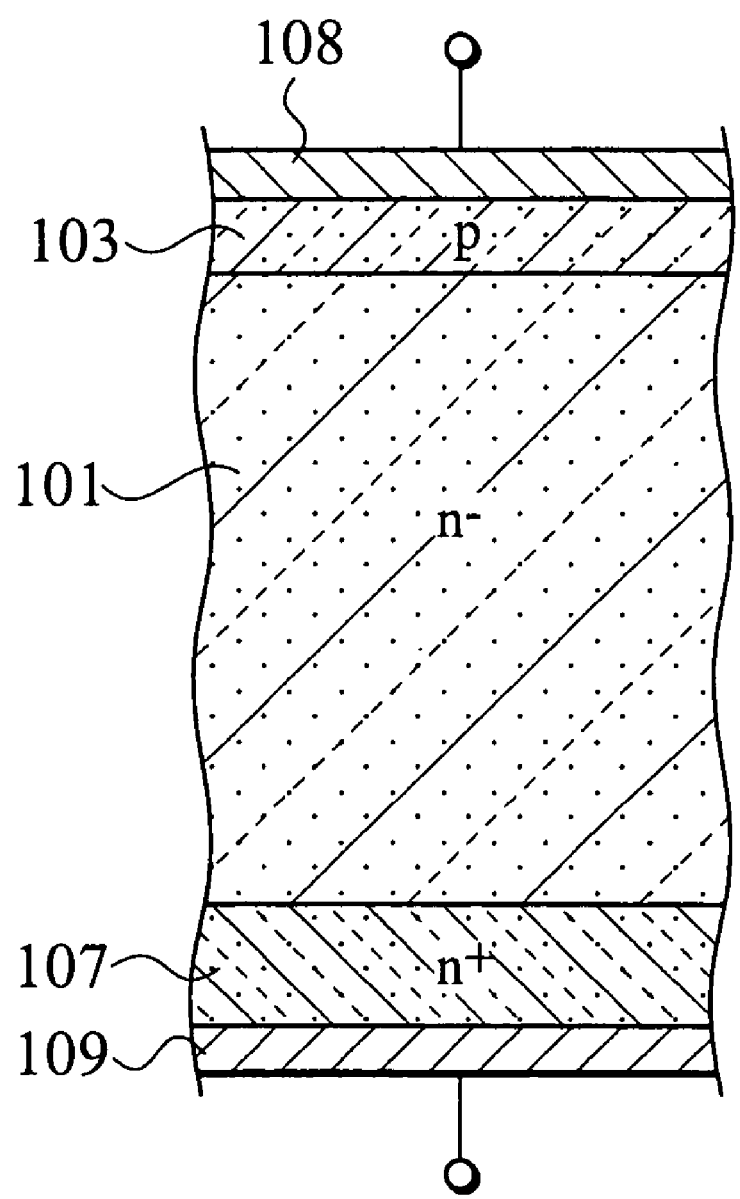
FIG. 1 is a cross-sectional view of a PiN diode according to the related art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

Figure 2:
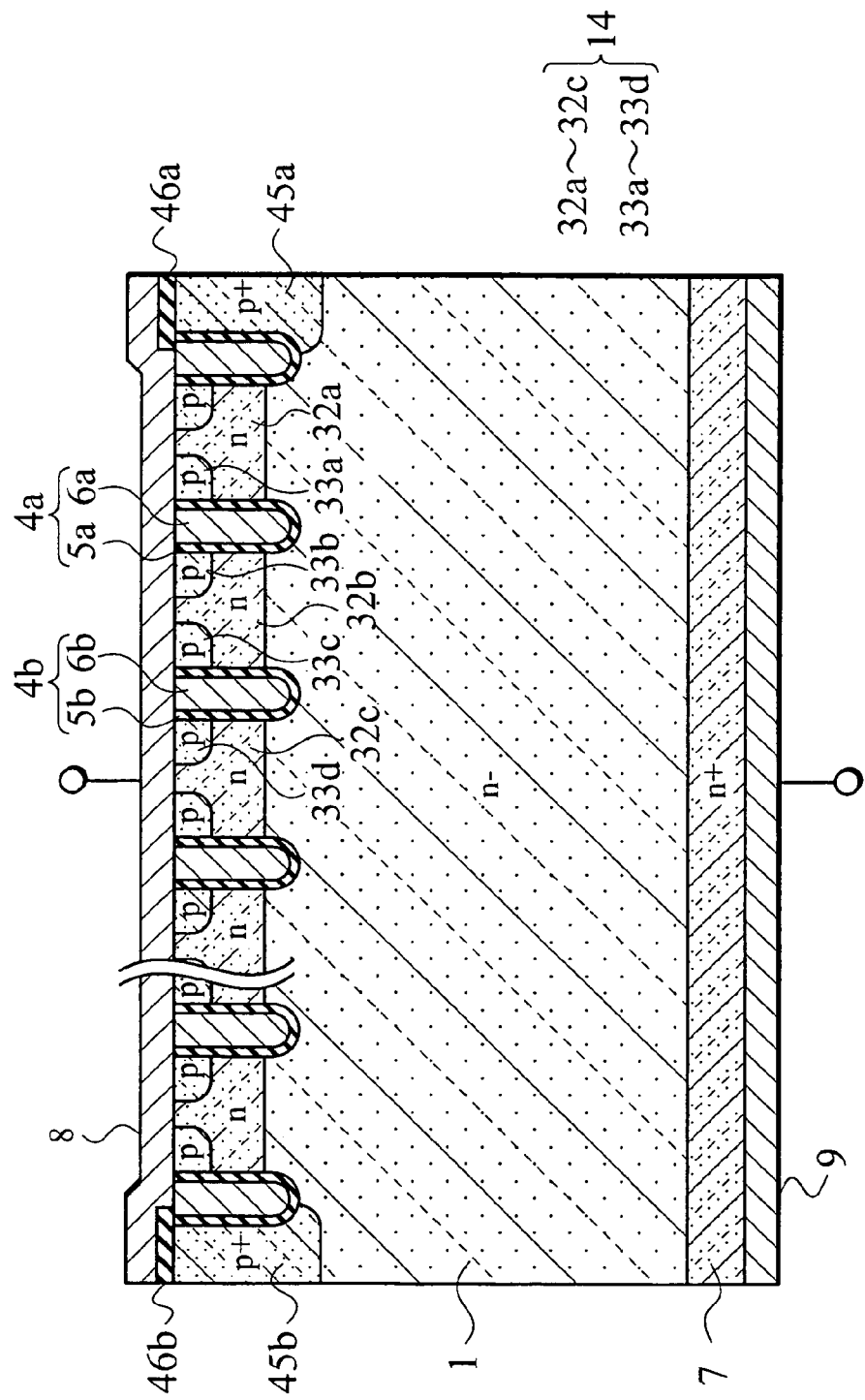
FIG. 2 is a cross-sectional, view of a semiconductor power device according to a first embodiment of the present invention.

As is shown in FIG. 2, a semiconductor power device according to a first embodiment of the present invention has a base layer 1, which has a first main surface and a second main surface opposite the first main surface, a first main electrode layer (anode layer) 14 connected on the first main surface to the base layer 1, a plurality of control regions 4a and 4b arranged inside grooves which penetrate the anode layer 14 and reach inside the base layer 1, a second main electrode layer (cathode layer) 7 connected on the second main surface to the base layer 1, a first main electrode (anode electrode) 8 connected to the anode layer 14, a second main electrode (cathode electrode) 9 connected to the cathode layer 7, ring regions 45a and 45b, located along the outer walls of the control regions located in both edges, among the control regions 4a and 4b, and interlayer insulating films 46a and 46b, respectively located between the ring areas 45a and 45b and the anode electrode 8.

The anode layer 14 includes a plurality of barrier layers 32a, 32b and 32c positioned so that they contact the first main surface of the base layer 1, and first main electrode regions (anode regions) 33a, 33b, 33c and 33d selectively arranged in the barrier layers 32a, 32b and 32c. The anode electrode 8 is Schottky-contacted to the barrier layers 32a, 32b and 32c, and is ohmic-contacted to the anode regions 33a, 33b, 33c and 33d.

The control regions 4a and 4b respectively include control insulating films 5a and 5b deposited along the sides and the bottoms of the grooves, and conductor regions 6a and 6b arranged inside the control insulating films 5a and 5b. The conductor regions 6a and 6b are connected to the anode electrode 8.

The base layer 1 is formed of a semiconductor of a first conductivity type. The barrier layers 32a, 32b and 32c are formed of semiconductors of the first conductivity type having a higher impurity concentration than the base layer 1. That is, each of the impurity concentrations of the barrier layers 32a, 32b and 32c is set higher than the impurity concentration in the base layer 1. The anode regions 33a, 33b, 33c and 33d and the ring regions 45a and 45b are formed of semiconductors of a second conductivity type, and the cathode layer 7 is formed of a semiconductor of the first conductivity type. The first conductivity type and the second conductivity type are apposed conductivity types. That is, when the first conductivity type is an n type, the second conductivity type is a p type, and when the first conductivity type is a p type, the second conductivity type is an n type. Hereinafter, an explanation will be given in which the n type is employed as the first conductivity type and the p type is employed as the second conductivity type. Further, in consonance with the impurity concentrations, an "n⁻ type" is employed for the base layer 1, "n types" are employed for the barrier layers 32a, 32b and 32c, an "n⁺ type" is employed for the cathode layer 7, "p types" are employed for the anode regions 33a, 33b, 33c and 33d, and "p⁺ types" are employed for the ring regions 45a and 45b.

The ring regions 45a and 45b are formed adjacent to and deeper than the control region 4a. The p-type impurity concentrations in the ring regions 45a and 45b are set so that they will not be depleted in the blocking state. The ring regions 45a and 45b are insulated from the anode electrode 8 by the interlayer insulating films 46a and 46b. It should be noted that, although not shown, the ring regions 45a and 45b are electrically connected to the anode regions 33a, 33b, 33c and 33d. Therefore, the ring regions 45a and 45b are connected to the anode electrode 8 through the anode regions 33a, 33b, 33c and 33d.

Figure 3:
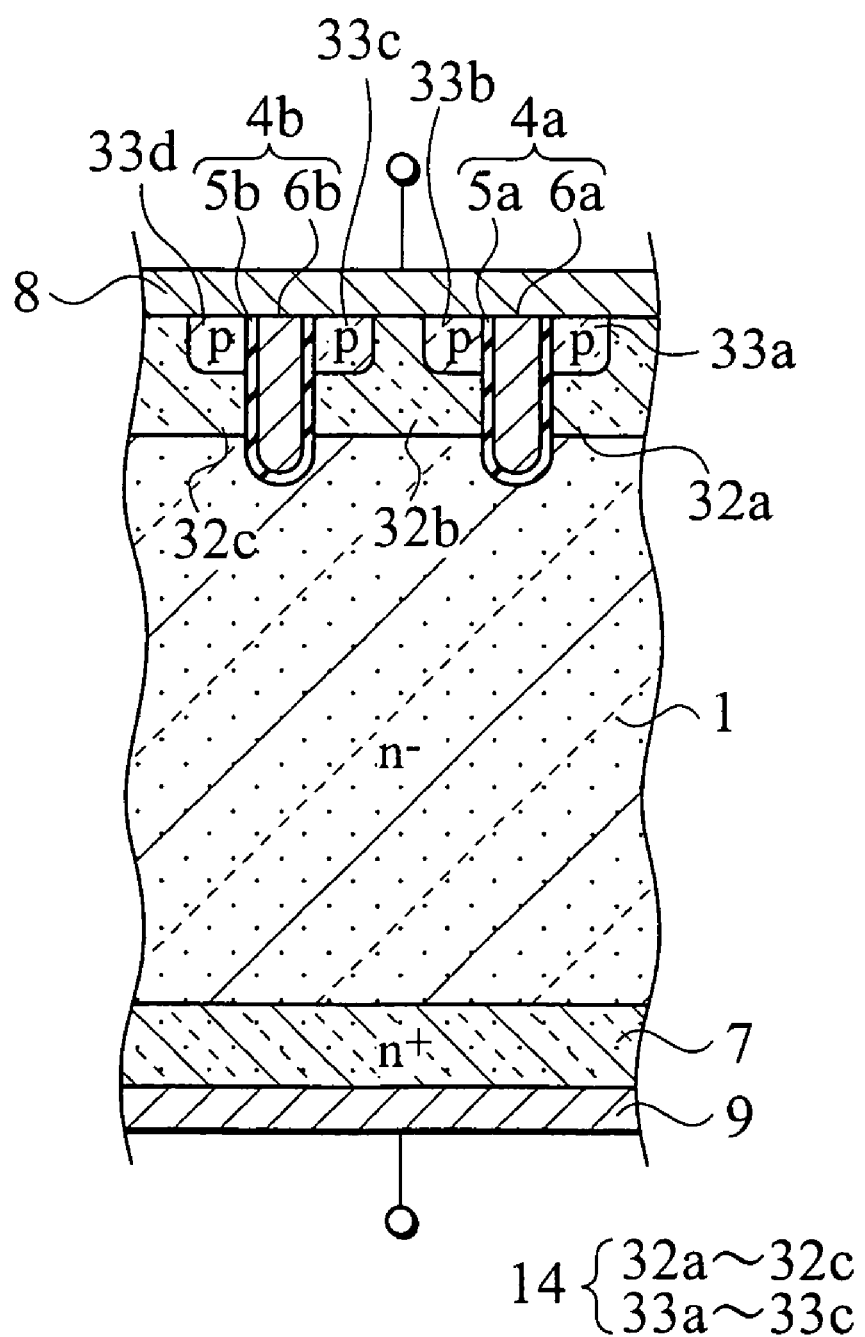
FIG. 3 is an enlarged cross-sectional view, taken along the line III—III in FIG. 4, of one part of the semiconductor power device in FIG. 2.

As is shown in FIG. 3, the anode layer 14 is arranged on the first main surface of the base layer 1, and the cathode layer 7 is arranged on the second main surface. The anode layer 14 includes barrier layers 32a, 32b and 32c which contact the first main surface, and the anode regions 33a, 33b, 33c and 33d which are selectively arranged in upper part of the barrier layers 32a, 32b and 32c. The control regions 4a and 4b are arranged inside the grooves that respectively penetrate the anode regions 33a, 33b, 33c and 33d and the barrier layers 32a, 32b and 32c, and penetrate the base layer 1 to a specific depth. The control insulating films 5a and 5b are thin films formed along the sides and the bottoms of the grooves. The conductor regions 6a and 6b are respectively located to fill the grooves together with the insulating films 5a and 5b. The anode electrode 8 is connected to the anode regions 33a, 33b, 33c and 33d, the barrier layers 32a, 32b and 32c and the conductor regions 6a and 6b. The cathode electrode 9 is connected to the cathode layer 7.

Figure 4:
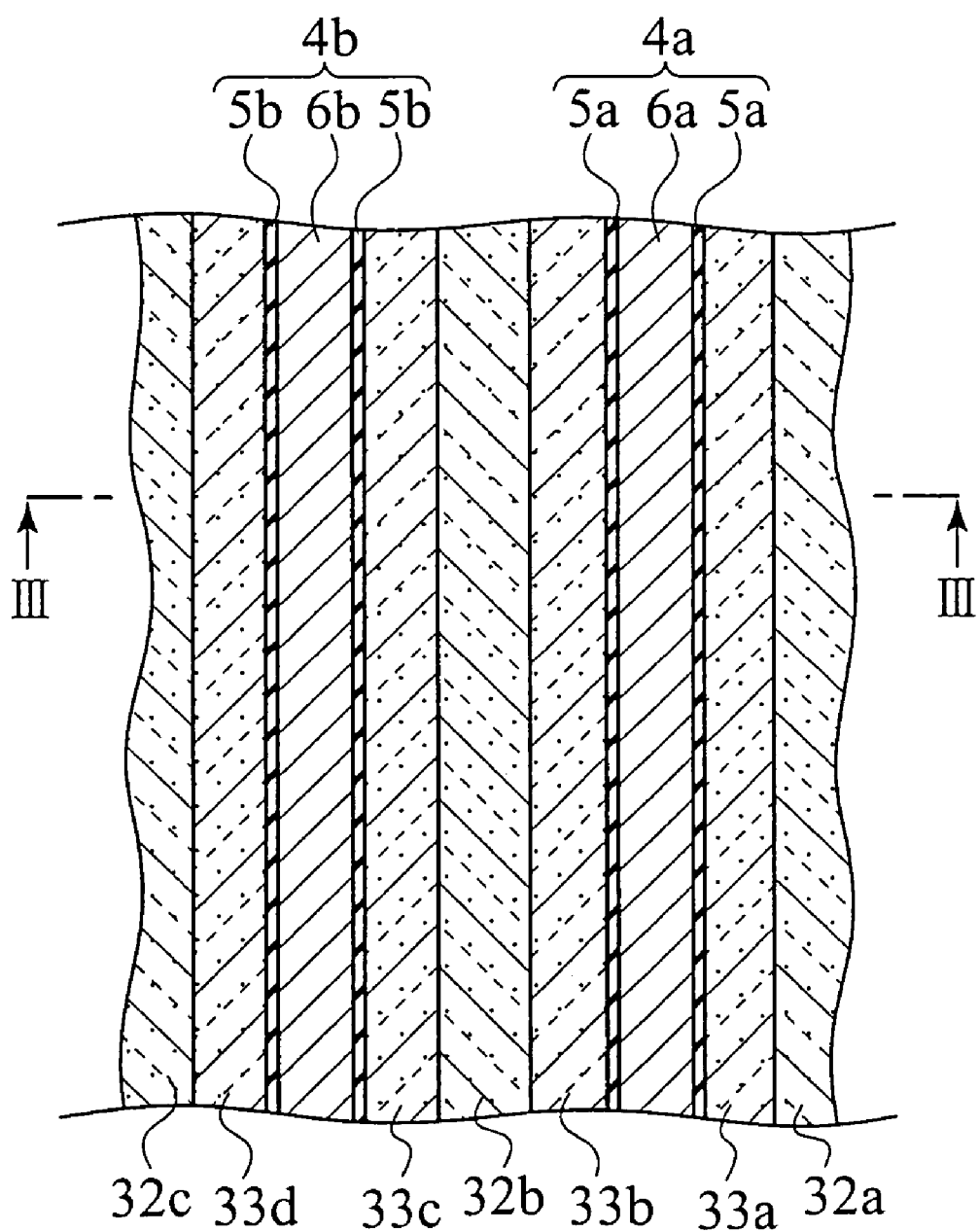
FIG. 4 is a diagram showing one part of the plane of the semiconductor power device in FIG. 2 that contacts an anode electrode, which is not shown.

As is shown in FIG. 4, the anode regions 33a, 33b, 33c and 33d, the barrier layers 32a, 32b and 32c, the control insulating films 5a and 5b, and the conductor regions 6a and 6b are aligned on the plane contacting the anode electrode 8. The control regions 4a and 4b are arranged such as stripes at a predetermined interval. The control insulating films 5a and 5b are arranged along both sides of their respective, corresponding conductor regions 6a and 6b. The anode region 33b, the barrier layer 32b and the anode region 33c are located between the control regions 4a and 4b.

An explanation will be given for the operation of the semiconductor power device in FIGS. 2 to 4 in the conductive state and in the reverse recovery condition. A voltage, which is positive relative to the cathode electrode 9, is applied to the anode electrode 8. This "positive voltage", which is higher than a diffusion potential at the pn junctions between the barrier layers 32a, 32b and 32c and the anode regions 33a, 33b and 33c and 33d, respectively. The barrier layers 32a, 32b and 32c are then utilized to inject holes from the anode regions 33a, 33b, 33c and 33d into the barrier layers 32a, 32b and 32c, and in consonance with the number of holes injected, electrons from the cathode layer 8 are also injected into the base layer 1. Carriers are accumulated in the base layer 1, and the resistance of the base layer 1 is reduced. Further, the electrons are discharged to the anode electrode 8 at the Schottky contact interfaces of the barrier layers 32a, 32b and 32c. The semiconductor power device is thereby rendered conductive, and a current flows from the anode electrode 8 to the cathode electrode 9.

An explanation will now be given for a reverse recovery operation for the inversion, in the conductive state, of the polarity of a voltage applied between the anode electrode 8 and the cathode electrode 9. When the polarity of a voltage applied in the conductive state is inverted, the carriers are discharged from the base layer 1, and depletion layers begin to spread from the pn junctions between the barrier layers 32a, 32b and 32c and the anode regions 33a, 33b and 33c, and 33d, respectively. A depletion layer also begins to spread from the Schottky contact interface of the barrier layers 32a, 32b and 32c, and as a result, the current flowing between the anode electrode 8 and the cathode electrode 9 is halted, and the semiconductor power device is set to the blocking state.

As is described above, since the barrier layers 32a, 32b and 32c are deposited between the anode regions 33a, 33b, 33c and 33d and the base layer 1, the number of holes injected into the base layer 1 from the anode regions 33a, 33b, 33c and 33d is reduced. Thus, the carriers accumulated in the base layer 1 in the conductive state are reduced. As a result, the reverse recovery loss on the semiconductor power device is reduced.

Furthermore, since the conductor regions 6a and 6b are connected to the anode electrode 8, the potentials of the conductor regions 6a and 6b, located in the base layer 1, are the same as the potential of the anode electrode 8. Therefore, in the reverse recovery condition, the depletion layers begin to spread out from the portions whereat, the control regions 4a and 4b contact the base layer 1. Thus, at the pn junction interfaces between the anode regions 33a, 33b and 33c and 33d and the barrier layers 32a, 32b and 32c, respectively, and at the Schottky contact interfaces between the anode electrode 8 and the barrier layers 32a, 32b and 32c, the electric field strength is reduced. The semiconductor power device can obtain a satisfactory high breakdown voltage for the blocking state.

In addition, based on the MOS structure of the conductor regions 6a and 6b, the control insulating films 5a and 5b and the barrier layers 32a, 32b and 32c, in the reverse recovery condition, an inversion layer is formed on the barrier layers 32a, 32b and 32c contacting the control regions 4a and 4b. As a result, since the holes are quickly discharged in the reverse recovery condition, the reverse recovery loss is further reduced.

Further, since the ring regions 45a and 45b are provided, the increase of the electric field at the edge of the control region 45a can be prevented. Since the ring regions 45a and 45b and the anode electrode 8 are not directly connected, the increase of a current at the ring regions 45a and 45b can be prevented. Thus, thermal destruction during the reverse recovery can be prevented.

In a cross section taken along III—III in FIG. 4, the conductor regions 6a and 6b are connected to the anode electrode 8. However, in a cross section that differs from the cross section taken along III—III, the conductor regions 6a and 6b may be connected to the anode electrode 8. That is, the conductor regions 6a and 6b can just be connected to the anode electrode 8, at least, at one location on the plane in FIG. 4.

In the first embodiment, it is preferable that the impurity concentrations of the barrier layers 32a, 32b and 32c be $1 \times 10^{11}$ to $1 \times 10^{14}$ cm$^{-2}$.

To obtain the effectiveness mentioned above, the depths of the control regions 4a and 4b and the distance between them are set in accordance with the impurity concentrations in the barrier layers 32a, 32b and 32c. When, for example, the maximum depth for the barrier layers 32a, 32b and 32c is 1 μm to 20 μm and the maximum impurity concentration is $1 \times 10^{13}$ cm$^{-3}$ to $1 \times 10^{17}$ cm$^{-3}$, the depth for the control regions 4a and 4b may be set to 1 μm to 20 μm and the distance set between the control regions 4a and 4b may be set to 0.5 μm to 5 μm. It should be noted that, although not shown, the ring regions 45a and 45b are electrically connected to the anode regions 33a, 33b, 33c and 33d. Accordingly, the ring regions 45a and 45b are connected to the anode electrode 8 through the anode region 33a, 33b, 33c and 33d.

The conductor regions 6a and 6b can be formed of, for example, heavily doped polycrystalline silicon doped, at high concentration, with phosphorus. Since no potential difference is present in the conductor regions 6a and 6b, the conductor regions 6a and 6b can be embedded in the grooves to produce a further reduction of the electric field. Furthermore, when the conductor regions 6a and 6b are connected to the anode electrode 8, the potentials of the conductor regions 6a and 6b can be stabilized and the deterioration of the breakdown voltage can be avoided.

A method for manufacturing the semiconductor power device in FIGS. 2 to 4 will now be explained by referring to FIGS. 5A, 5B, 6A and 6B. The cross sections in FIGS. 5A, 5B, 6A and 6B correspond to a cross section taken along III—III in FIG. 4.

Figure 5A:
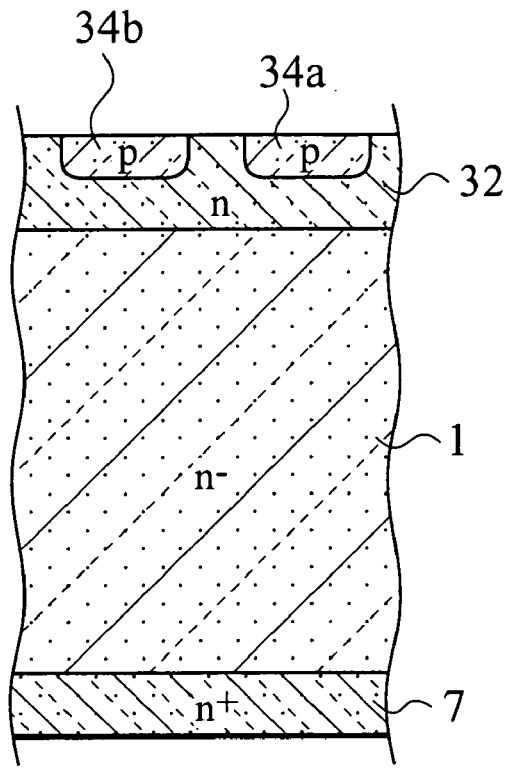
FIGS. 5A, 5B, 6A and 6B are cross-sectional views of the main manufacturing processes of a method employed to produce the semiconductor power device shown in FIG. 2.

(A) First, an n-type semiconductor layer having impurity concentration is higher than that of a semiconductor substrate is permitted to grow epitaxially on the first main surface of an n$^-$-type semiconductor substrate. A lithographic method is then used to selectively deposit an oxide film on the n-type semiconductor layer, following which, while employing the oxide film as a mask, boron (B) ions are selectively implanted into the upper portion of the n-type semiconductor layer. n-type impurity ions, such as phosphorus (P) ions or arsenic (As) ions, are implanted into the n$^-$-type semiconductor substrate through its second main surface, opposite its first main surface. As is shown in FIG. 5A, when an annealing process is performed in a nitrogen atmosphere, the n$^+$-type cathode layer 7, the n$^-$-type base layer 1 and the n-type barrier layer 32 can be formed, and the p-type anode regions 34a and 34b can be selectively formed in the upper portion of the barrier layer 32. Note that instead of epitaxial growth being employed, the n-type barrier layer 32 may be formed with ion implantation and thermal diffusion.

Figure 5B:
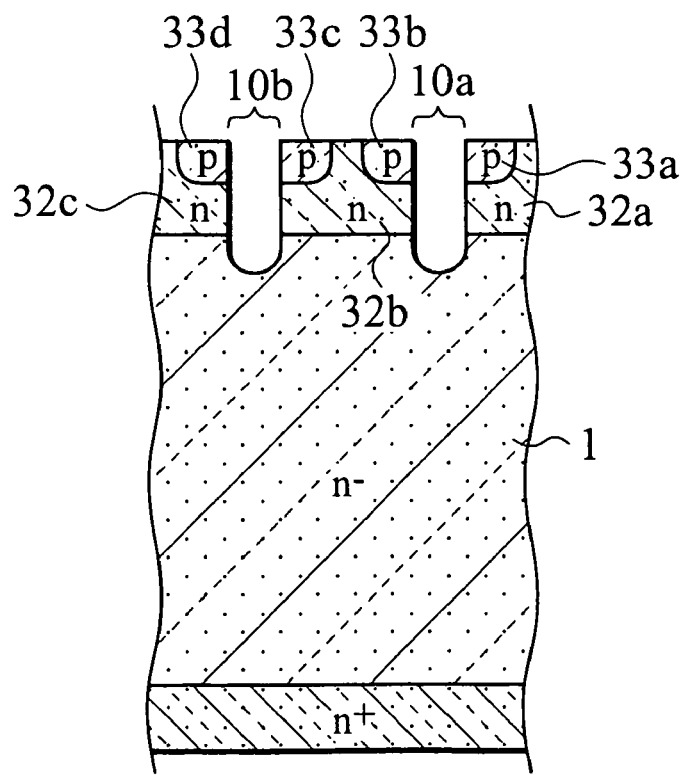

(B) The anode regions 34a and 34b, the barrier layer 32 and a part of the base layer 1 are selectively removed using photolithography and anisotropic etching, for which reactive ion etching (RIE) can be employed. The anode regions 34a and 34b are selectively removed, and the barrier layer 32 is selectively removed. When a part of the base layer 1 is selectively removed down to a specific depth, the anisotropic etching is terminated. Thereafter, isotropic etching is performed. As is shown in FIG. 5B, grooves 10a and 10b which penetrate the anode regions 33a, 33b and 33c and the barrier layers 32a, 32b and 32c, and approach the base layer 1 to a specific depth, are formed. Through the isotropic etching, the bottoms of the grooves 10a and 10b are formed as curved faces, contiguous with both sides of the grooves 10a and 10b, respectively.

Figure 6A:
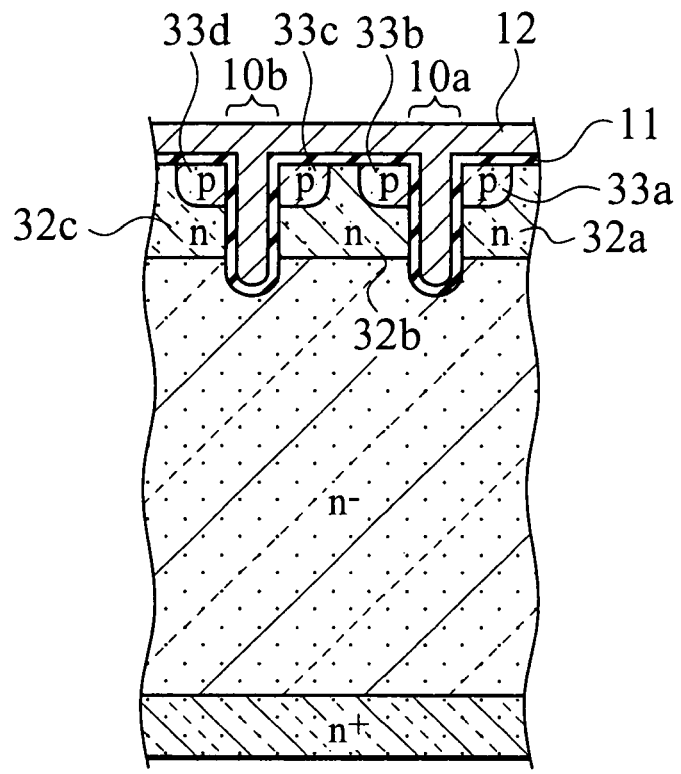

(C) As is shown in FIG. 6A, by employing the thermal oxidization method or the chemical vapor deposition (CVD) method, an insulating film 11 is deposited on the inner walls of the grooves 10a and 10b, and on the anode regions 33a, 33b, 33c and 33d and the barrier layers 32a, 32b and 32c. An oxide film, a nitride film or an oxide nitride film can be employed as the insulating film 11. The insulating film 11 is not thick enough to fill the grooves 10a and 10b. Then, the CVD method or the sputtering method is used to deposit a conductor film 12 on the insulating film 11. The conductor film 12 is deposited so that the grooves 10a and 10b are embedded. Aluminum (Al), titanium (Ti), tungsten (W), molybdenum (Mo), an Al—Si alloy, TiW, WSi, TiSi or poly Si can be employed for the conductor film 12.

Figure 6B:
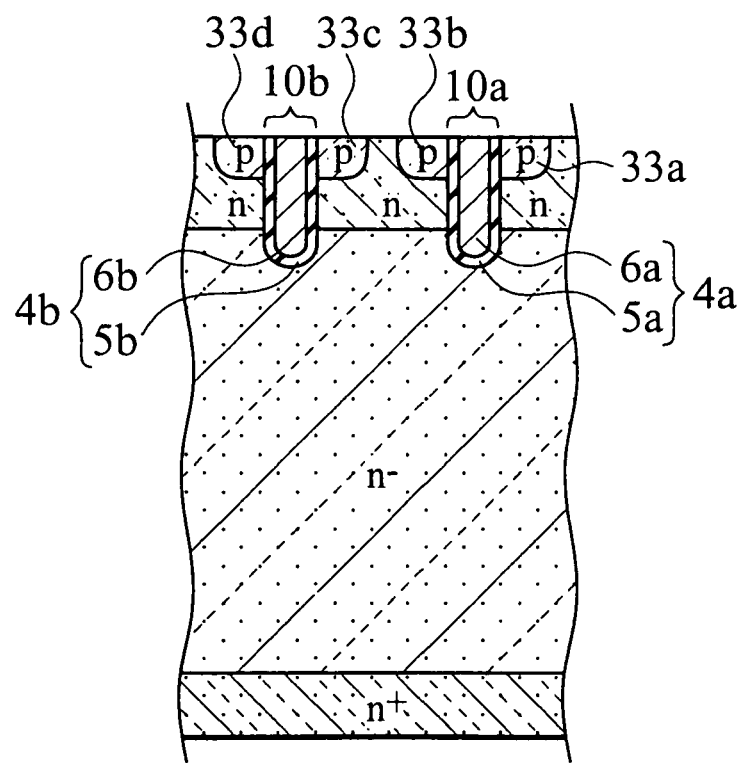

(D) The conductor film 12 and the insulating film 11 deposited on the anode regions 33a, 33b, 33c and 33d and the barrier layers 32a, 32b and 32c, are removed using a planarization method such as a chemical-mechanical polishing (CMP) method. The planarization process is terminated when the conductor film 12 and the insulating film 11 are partially removed, and when the anode regions 33a, 33b, 33c and 33d, and the barrier layers 32a, 32b and 32c are exposed. As is shown in FIG. 6B, the control regions 4a and 4b, which respectively include the control insulating films 5a and 5b and the conductor regions 6a and 6b, are embedded in the grooves 10a and 10b.

(E) Finally, a sputtering method or a metal evaporation method is used to deposit the anode electrode 8 on the anode regions 33a, 33b, 33c and 33d, the barrier layers 32a, 32b and 32c, and the control regions 4a and 4b. By using a sputtering method or a metal evaporation method, the cathode electrode 9 is deposited on the cathode layer 7. Through these procedures, the semiconductor power device shown in FIGS. 2 to 4 is completed.

As is described above, since the bottoms of the grooves 10a and 10b are formed as curved faces by the isotropic etching, the increase of the electric fields at the edges of the control regions 4a and 4b can be prevented.

Modification of the First Embodiment

Figure 7:
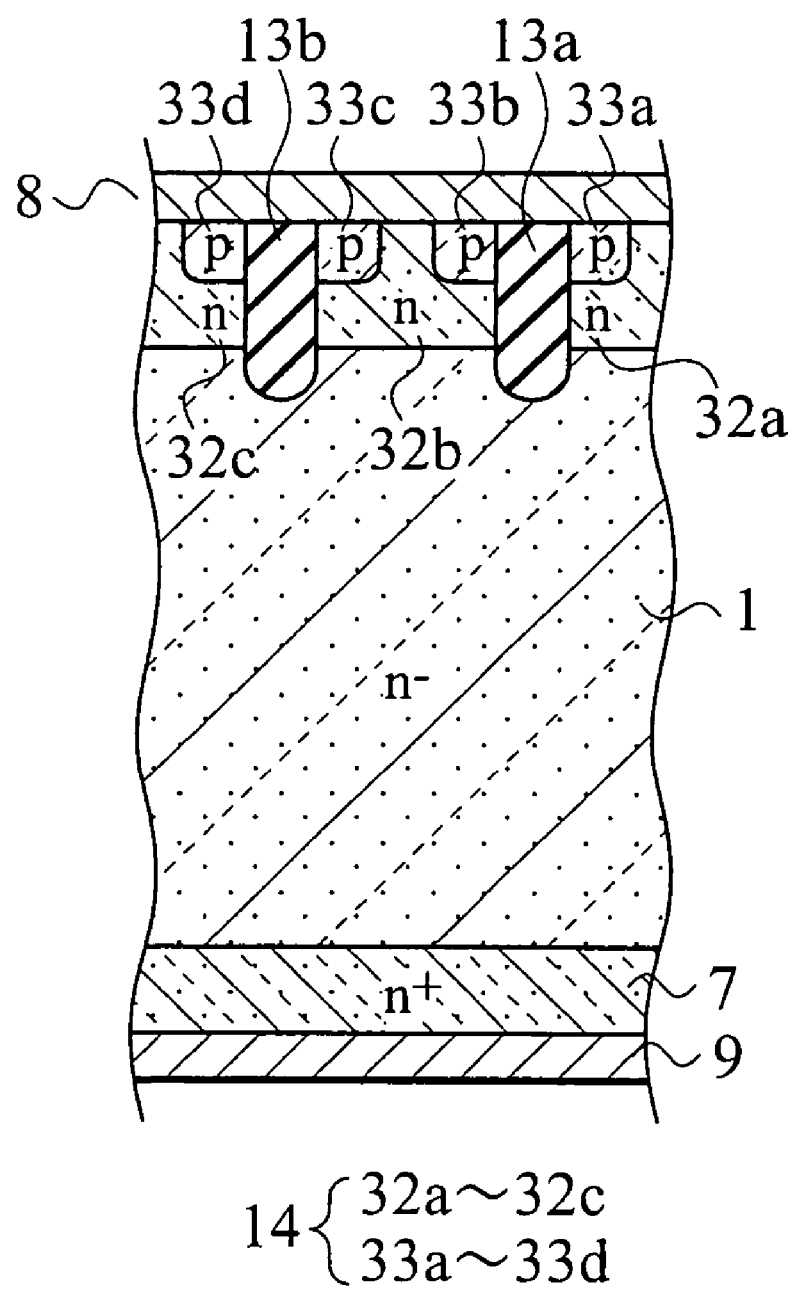
FIG. 7 is a cross-sectional view of one part of a semiconductor power device according to a modification of the first embodiment.

As is shown in FIG. 7, a semiconductor power device according to a modification of the first embodiment includes a base layer 1 which has a first main surface and a second main surface opposite the first main surface, an anode layer 14 connected to the first main surface of the base layer 1, insulator regions 13a and 13b located inside the grooves that penetrate the anode layer 14 and reach inside the base layer 1, a cathode layer 7 connected to the second main surface of the base layer 1, an anode electrode 8 connected to the anode layer 14, and a cathode electrode 9 connected to the cathode layer 7. The anode layer 14 includes barrier layers 32a, 32b and 32c which contact the first main surface of the base layer 1, and anode regions 33a, 33b, 33c and 33d which are selectively arranged in the barrier layers 32a, 32b and 32c. The anode electrode 8 is Schottky-contacted to the barrier layers 32a, 32b and 32c, and is ohmic-contacted to the anode regions 33a, 33b, 33c and 33d. A difference between the semiconductor power device in FIG. 3 and this modification is that insulator regions 13a and 13b composed of an insulating material are arranged inside the grooves.

Since the barrier layers 32a, 32b and 32c are respectively formed between the anode regions 33a, 33b, 33c and 33d and the base layer 1, the number of holes injected into the base layer 1 from the anode regions 33a, 33b, 33c and 33d is limited. Therefore, the number of carriers accumulated in the base layer 1 in the conductive state is likewise reduced. As a result, the reverse recovery loss in the semiconductor power device is reduced.

Further, since the insulator regions 13a and 13b are located inside the grooves, in the reverse recovery condition, the electric field is increased in the bottoms of the grooves. Therefore, the electric fields between the barrier layers 32a, 32b and 32c and the anode regions 33a, 33b, 33c and 33d, respectively, are reduced. Thus, while in the reverse recovery condition, depletion layers spread out from the portion of the base layer 1 that contacts the insulator regions 13a and 13b. The semiconductor power device can obtain a satisfactory high breakdown voltage during the reverse recovery.

As a result, an avalanche yield seldom occurs, and a reduction in the high breakdown voltage during a reverse recovery can be avoided.

SECOND EMBODIMENT

Figure 8:
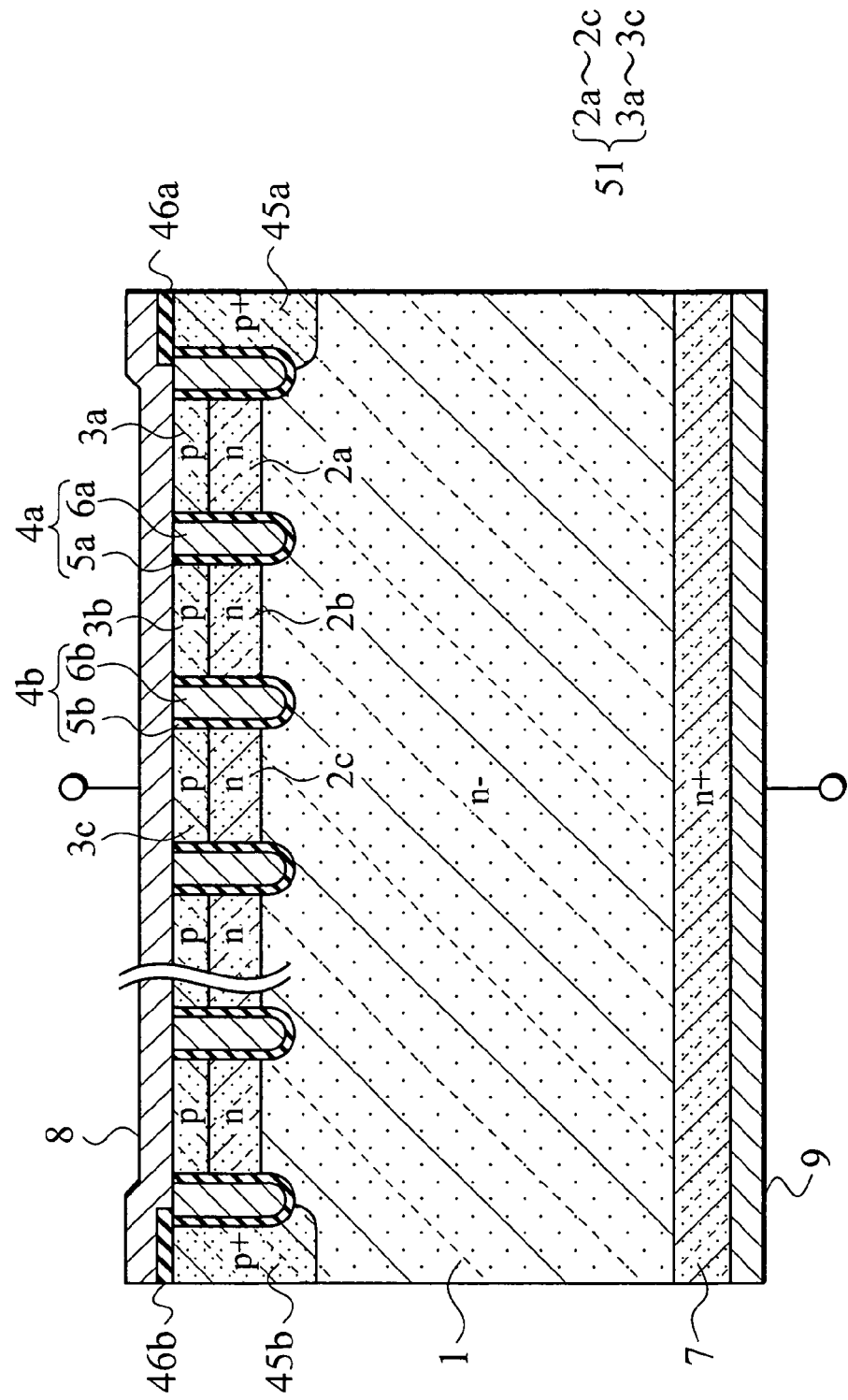
FIG. 8 is a cross-sectional, view of a semiconductor power device according to a second embodiment of the present invention.

As is shown in FIG. 8, a semiconductor power device according to a second embodiment includes a base layer 1 which has a first main surface and a second main surface opposite the first main surface, an anode layer 51 connected to the first main surface of the base layer 1, control regions 4a and 4b located inside grooves that penetrate the anode layer 51 and reach inside the base layer 1, a cathode layer 7 connected to the second main surface of the base layer 1, an anode electrode 8 connected to the anode layer 51, a cathode electrode 9 connected to the cathode layer 7, ring regions 45a and 45b arranged along the outer surfaces of the control regions on both sides of the structure among the control regions 4a and 4b, and interlayer insulating films 46a and 46b respectively located between the ring regions 45a and 45b and the anode electrode 8.

The anode layer 51 includes barrier layers 2a, 2b and 2c which contact the first main surface of the base layer 1, and anode regions 3a, 3b and 3c, which are selectively arranged in the barriers 2a, 2b and 2c, respectively. The anode electrode 8 is ohmic-contacted to the anode regions 3a, 3b and 3c. The control regions 4a and 4b respectively contact the barrier layers 2a, 2b and 2c and the anode regions 3a, 3b and 3c.

The control regions 4a and 4b respectively include control insulating films 5a and 5b arranged along the sides and bottoms of grooves, and conductor regions 6a and 6b arranged inside the control insulating films 5a and 5b. The conductor regions 6a and 6b are connected to the anode electrode 8.

Figure 9:
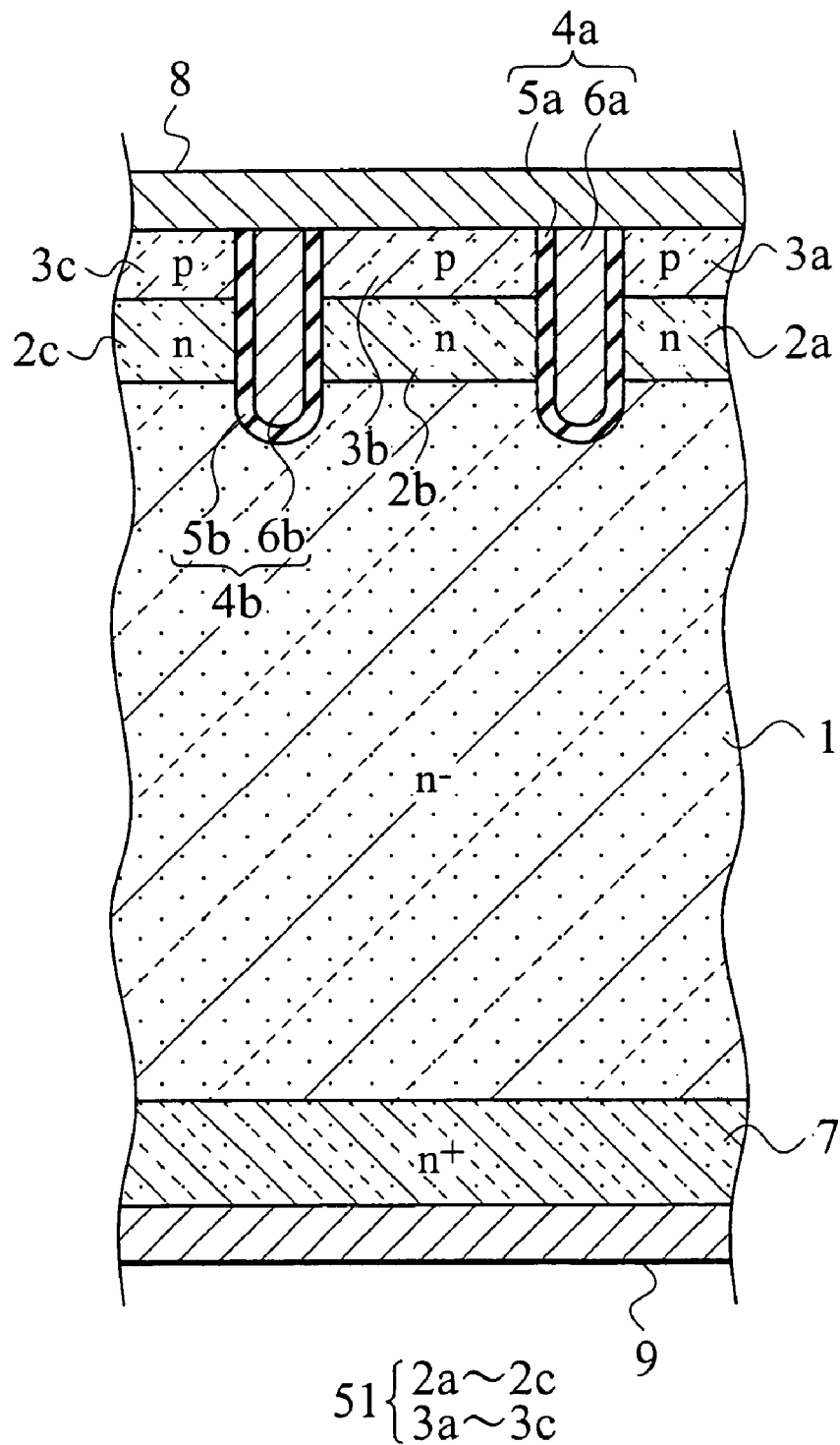
FIG. 9 is an enlarged cross-sectional view, taken along line IXA—IXA in FIG. 10, of one part of the semiconductor power device in FIG. 8.

As is shown in FIG. 9, the anode layer 51 is located on the main surface of the base layer 1, and the cathode layer 7 is located on the second main surface. The anode layer 51 includes barrier layers 2a, 2b and 2c which contact the first main surface, and anode regions 3a, 3b and 3c selectively positioned on the barrier layers 2a, 2b and 2c, respectively. The control regions 4a and 4b are respectively arranged inside the grooves that penetrate the anode regions 3a, 3b and 3c and the barrier layers 2a, 2b and 2c and that approach the base layer 1 to a specific depth. The control insulating films 5a and 5b are thin films arranged along the sides and bottoms of the grooves. The conductor regions 6a and 6b are located to fill the grooves together with the control insulating films 5a and 5b. The anode electrode 8 is connected to the anode regions 3a, 3b and 3c and the conductor regions 6a and 6b, and the cathode electrode 9 is connected to the cathode layer 7. While the barrier layers 32a, 32b and 32c of the semiconductor power device shown in FIG. 3 are Schottky-contacted to the anode electrode 8, the barrier layers 2a, 2b and 2c of the semiconductor power device shown in FIG. 9 are not Schottky-contacted to the anode electrode 8, and the anode regions 3a, 3b and 3c are uniformly arranged on the barrier layers 2a, 2b and 2c, respectively.

Figure 10:
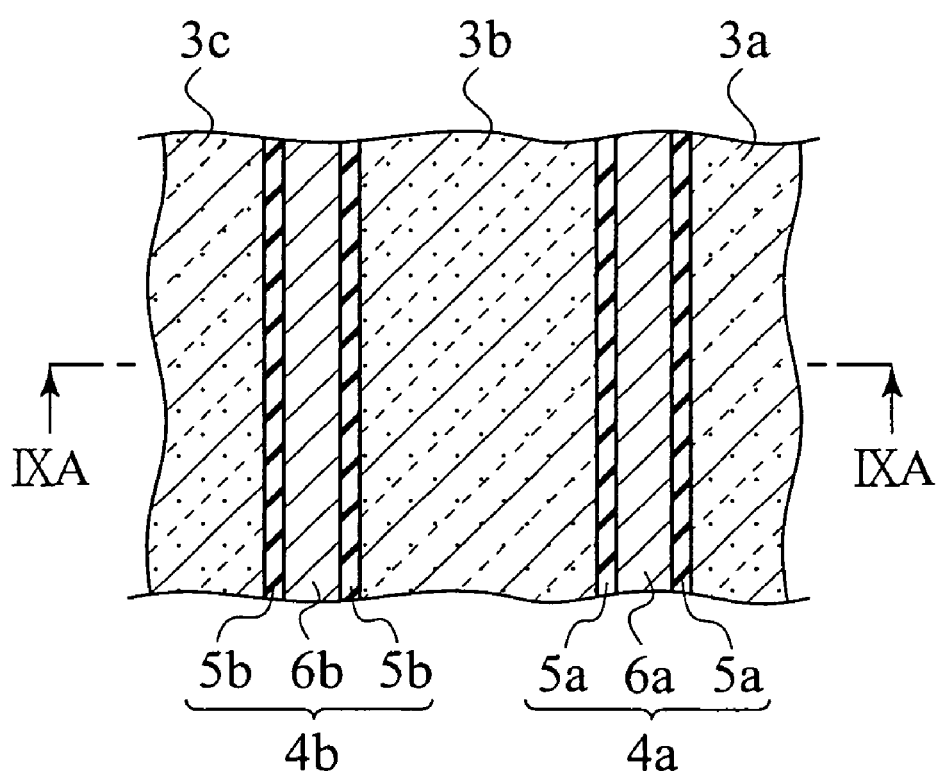
FIG. 10 is a diagram showing one part of the plane of the semiconductor power device in FIG. 8 that contacts an anode electrode, which is not shown.

As is shown in FIG. 10, the anode regions 3a, 3b and 3c, the control insulating films 5a and 5b and the conductor regions 6a and 6b are exposed on the plane contacting the anode electrode 8. The control regions 4a and 4b are arranged such as stripes at a predetermined interval. The insulating films 5a and 5b are located on both sides of the conductor regions 6a and 6b, respectively. The anode region 3b is located between the control regions 4a and 4b, and the anode regions 3a and 3b are respectively located outside the control regions 4a and 4b.

An explanation will now be given for the operations of the semiconductor power device shown in FIGS. 8 to 10 in the conductive state and in the reverse recovery condition. A positive voltage, relative to the cathode electrode 9, is applied to the anode electrode 8. The "positive voltage" is higher than the diffusion potentials generated at the pn junctions between the barrier layers 2a, 2b and 2c and the anode regions 3a, 3b and 3c, respectively. Then, holes are injected into the barrier layers 2a, 2b and 2c from the anode regions 3a, 3b and 3c, respectively. In consonance with the number of holes injected, electrons are injected from the cathode layer 7 into the base layer 1. The carriers are accumulated in the base layer 1, and the resistance of the base layer 1 is reduced. Thus, the semiconductor power device is rendered conductive, and a current flows from the anode electrode 8 to the cathode electrode 9.

An explanation will now be given for the reverse recovery processing performed to invert the polarity of a voltage applied between the anode electrode 8 and the cathode electrode 9 in the conductive state. When the voltage to be applied in the conductive state is inverted, the carriers are discharged from the base layer 1, and depletion layers begin to spread from the pn junctions between the barrier layers 2a, 2b and 2c and the anode regions 3a, 3b and 3c, respectively. As a result, a current flowing between the anode electrode 8 and the cathode electrode 9, is halted, and the semiconductor power device is set to the blocking state.

As is described above, since the barrier layers 2a, 2b and 2c are respectively formed between the anode regions 3a, 3b and 3c and the base layer 1, the number of holes injected into the base layer 1 from the anode regions 3a, 3b and 3c is limited. Therefore, the number of carriers accumulated in the base layer 1 in the conductive state is reduced. As a result, the reverse recovery loss of the semiconductor power device is reduced.

Since the conductor regions 6a and 6b are connected to the anode electrode 8, the potentials at the conductor regions 6a and 6b located in the base layer 1 are equal to the potential of the anode electrode 8. Therefore, in the reverse recovery condition, depletion layers spread beginning at the portions of the base layer 1 that contact the control regions 4a and 4b. Thus, the electrics field at the pn junctions between the anode regions 3a, 3b and 3c and the barrier layers 2a, 2b and 2c are reduced, and the semiconductor power device can obtain a satisfactory breakdown voltage during the reverse recovery.

Further, in the reverse recovery condition, based on the MOS structure of the conductor regions 6a and 6b, the control insulating films 5a and 5b and the barrier layers 2a, 2b and 2c, inversion layers are respectively formed on the barrier layers 2a, 2b and 2c contacting the control regions 4a and 4b. As a result, since the holes are quickly discharged in the reverse recovery condition, the reverse recovery loss can be reduced.

In addition, since the ring regions 45a and 45b are provided, increase of the electric field at the edges of the control regions 4a can be prevented. Further, since the ring regions 45a and 45b and the anode electrode 8 are not directly connected, the increase of a current in the ring regions 45a and 45b can be prevented. Thus, in the reverse recovery condition, the failure of the semiconductor power device can be prevented.

Figure 11A:
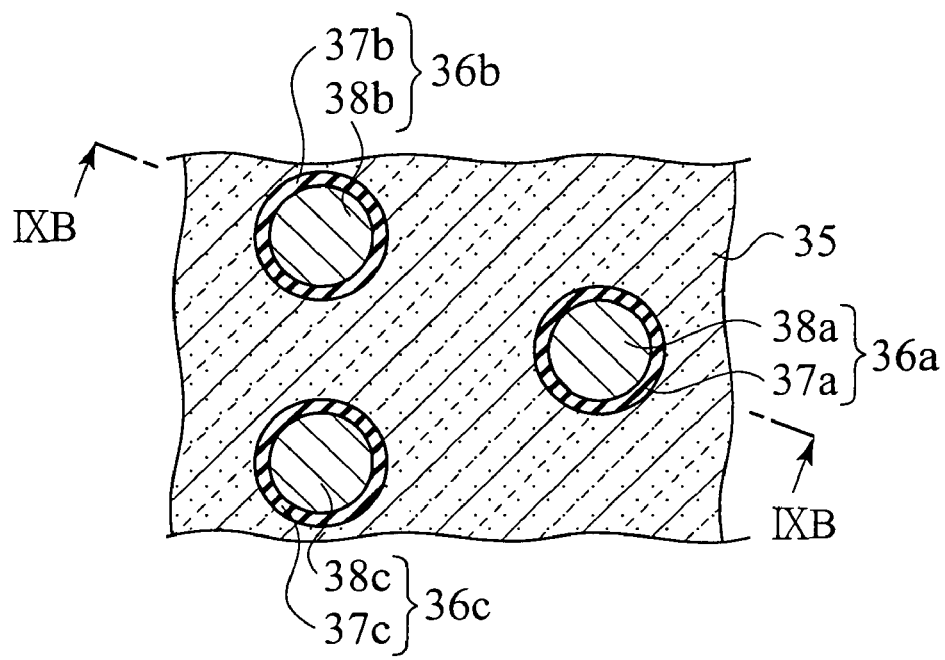
FIG. 11A is a plan view of a part of the semiconductor power device, for which an anode electrode is not shown, wherein circular control regions are arranged as separate dots, and wherein a cross section taken along line IXB—IXB would correspond to the cross-sectional view in FIG. 9.

It should be noted that, as is shown in FIG. 10, the control regions 4a and 4b are arranged such as stripes at a predetermined interval. However, the present invention is not limited to the arrangement as shown in FIG. 10. As is shown in FIG. 11A, control regions 36a, 36b and 36c may be shaped such as a circular plane, and may be dispersed at fixed intervals. The control regions 36a, 36b and 36c respectively include circular conductor regions 38a, 38b and 38c, and ring-shaped insulating films 37a, 37b and 37c, which enclose the conductor regions 38a, 38b and 38c around their external circumferences. The conductor regions are preferable to be arranged in the vertex of an equilateral triangle, a square or an equilateral hexagonal, for a balance of current density. An anode region 35 is exposed in an area wherein the control regions 36a, 36b and 36c are not arranged. A cross section taken along IXB—IXB in FIG. 11A corresponds to the cross section in FIG. 9. It should be noted that in FIG. 11A, the control regions 36a, 36b and 36c may be replaced with insulated regions for which an insulating material is employed.

Figure 11B:
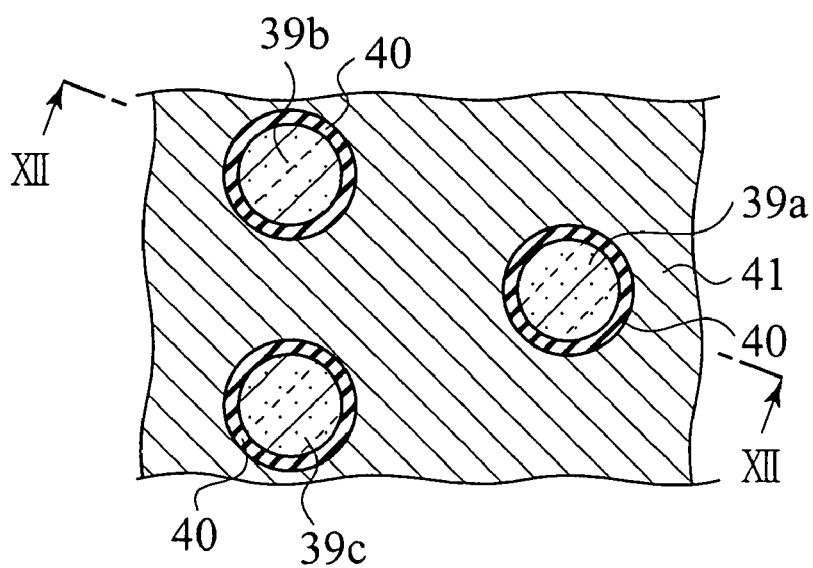
FIG. 11B is a plan view of a part of the semiconductor power device, for which an anode electrode is not shown, wherein circular anode regions are arranged as separate dots.

Furthermore, in FIG. 11A, the control regions 36a, 36b and 36c may be replaced with the anode region 35. That is, as is shown in FIG. 11B, anode regions 39a, 39b and 39c may be shaped such as circular planes and may be dispersed at fixed intervals. A control region (40, 41) is exposed in an area wherein the anode regions 39a, 39b and 39c are not formed. The control region (40, 41) includes ring-shaped control insulating films 40 that enclose, around their external circumferences, the anode regions 39a, 39b and 39c, and a conductor region 41 arranged in an area wherein the anode regions 39a, 39b and 39c and the insulating films 40 are not arranged. In FIG. 11B, the insulating films 40 and the conductor region 41 may be replaced with insulator regions for which an insulating material is employed.

Figure 12:
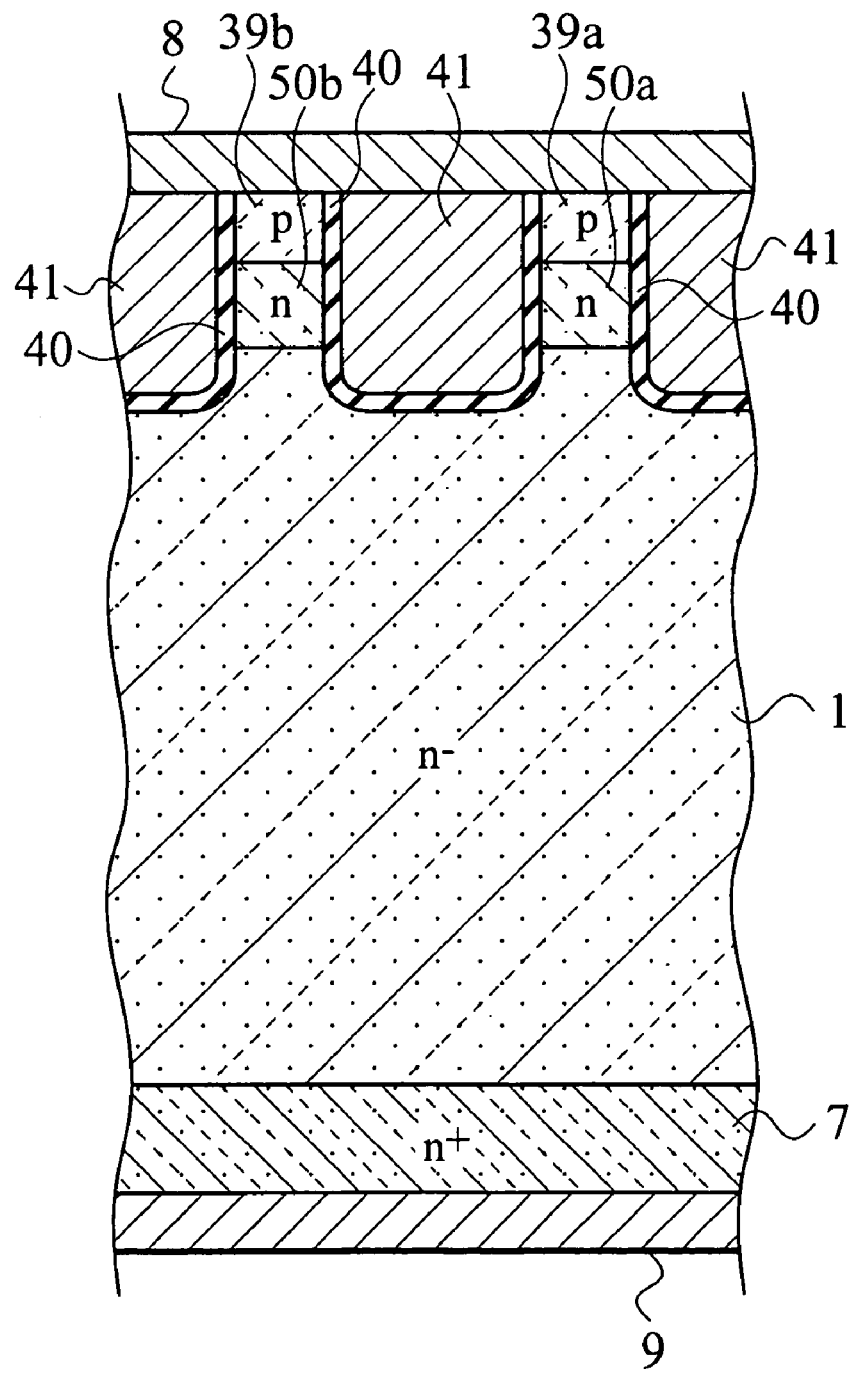
FIG. 12 is a cross-sectional view of the semiconductor power device shown in FIG. 11B taken along line XII—XII.

As is shown in a cross sectional view in FIG. 12, taken along XII—XII in FIG. 11B, the semiconductor power device includes a base layer 1 which has a first main surface and a second main surface opposite the first main surface, barrier layers 50a and 50b connected to the first main surface of the base layer 1, anode regions 39a and 39b selectively arranged in the barrier layers 50a and 50b, respectively, control regions (40, 41) located inside the grooves that penetrate the barrier layers 50a and 50b and the anode regions 39a and 39b, respectively, and reach inside the base layer 1, a cathode layer 7 connected to the second main surface of the base layer 1, an anode electrode 8 connected to the anode regions 39a and 39b and the control regions (40, 41), and a cathode electrode 9 connected to the cathode layer 7. The anode electrode 8 is ohmic-contacted to the anode regions 39 and 39b. Each of the control regions (40, 41) includes a control insulating film 40 located along the side and bottom of a groove, and a conductor region 41 located inside the control insulating film 40. The conductor region 41 is connected to the anode electrode 8.

Modification of the Second Embodiment

Figure 13:
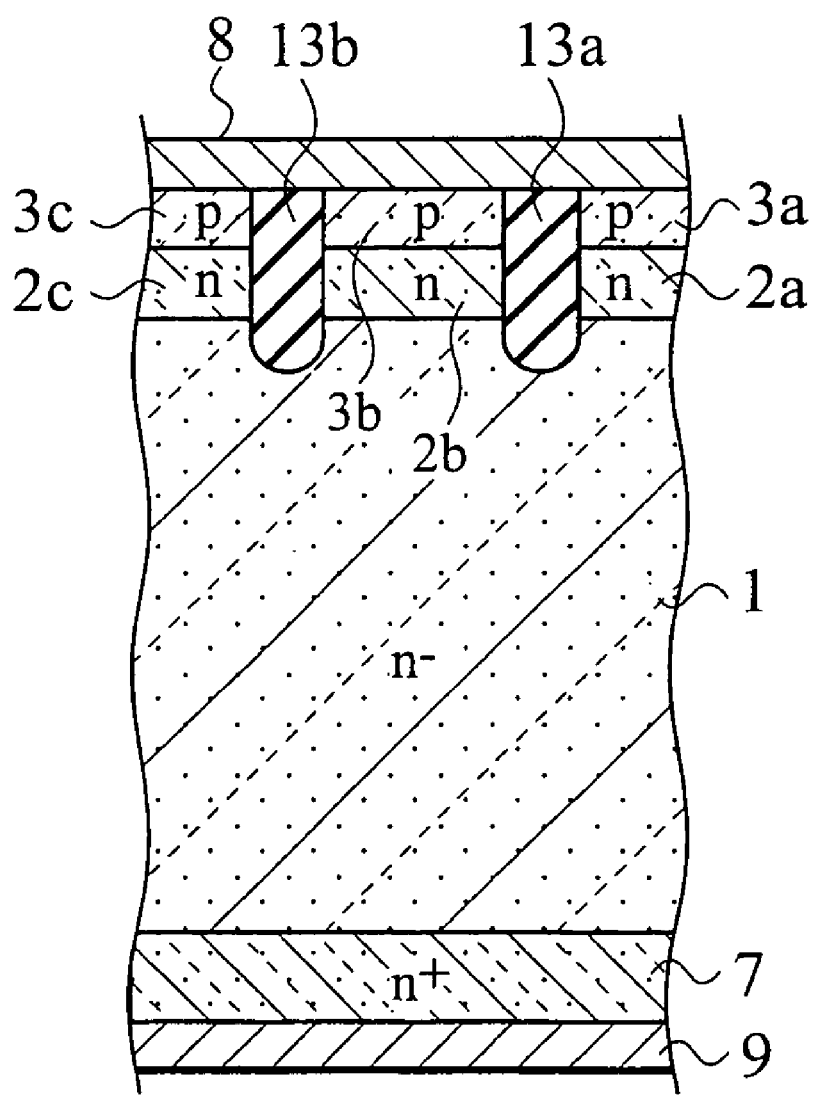
FIG. 13 is a cross-sectional view of a part of a semiconductor power device according to a modification of the second embodiment.

As is shown in FIG. 13, a semiconductor power device according to a modification of the second embodiment includes a base layer 1 which has a first main surface and a second main surface opposite the first main surface, an anode layer 51 connected to the first main surface of the base layer 1, insulator regions 13a and 13b arranged inside grooves that penetrate the anode layer 51 and enter the base layer 1, a cathode layer 7 connected to the second main surface of the base layer 1, an anode electrode 8 connected to the anode layer 51, and a cathode electrode 9 connected to the cathode layer 7. The anode layer 51 includes barrier layers 2a, 2b and 2c which contact the first main surface of the base layer 1, and anode regions 3a, 3b and 3c which are selectively arranged in the barrier layers 2a, 2b and 2c, respectively. The anode electrode 8 is ohmic-contacted to the anode regions 3a, 3b and 3c. A difference between the semiconductor device in FIG. 13 and the semiconductor device in FIG. 9 is that the insulator regions 13a and 13b are arranged inside the grooves.

Since the barriers 2a, 2b and 2c are respectively formed between the anode regions 3a, 3b and 3c and the base layer 1, the number of holes to be injected from the anode regions 3a, 3b and 3c into the base layer 1 is limited. Therefore, the number of carriers accumulated in the base layer 1 in the conductive state is reduced. As a result, for the semiconductor power device, the reverse recovery loss is reduced.

Further, since the insulator regions 13a and 13b are formed inside the grooves, the electric fields are increased in the bottoms of the grooves in the reverse recovery condition. Thus, the electric fields between the barrier layers 2a, 2b and 2c and the anode regions 3a, 3b and 3c are reduced, respectively. Therefore, in the reverse recovery condition, depletion layers spread out, beginning at the portion of the base layer 1 that contacts the insulator regions 13a and 13b. The semiconductor power device ensures that during the reverse recovery the breakdown voltage is satisfactory high. Thus, an avalanche yield seldom occurs, and a reduction in the breakdown voltage during a reverse recovery can be avoided.

THIRD EMBODIMENT

Figure 14:
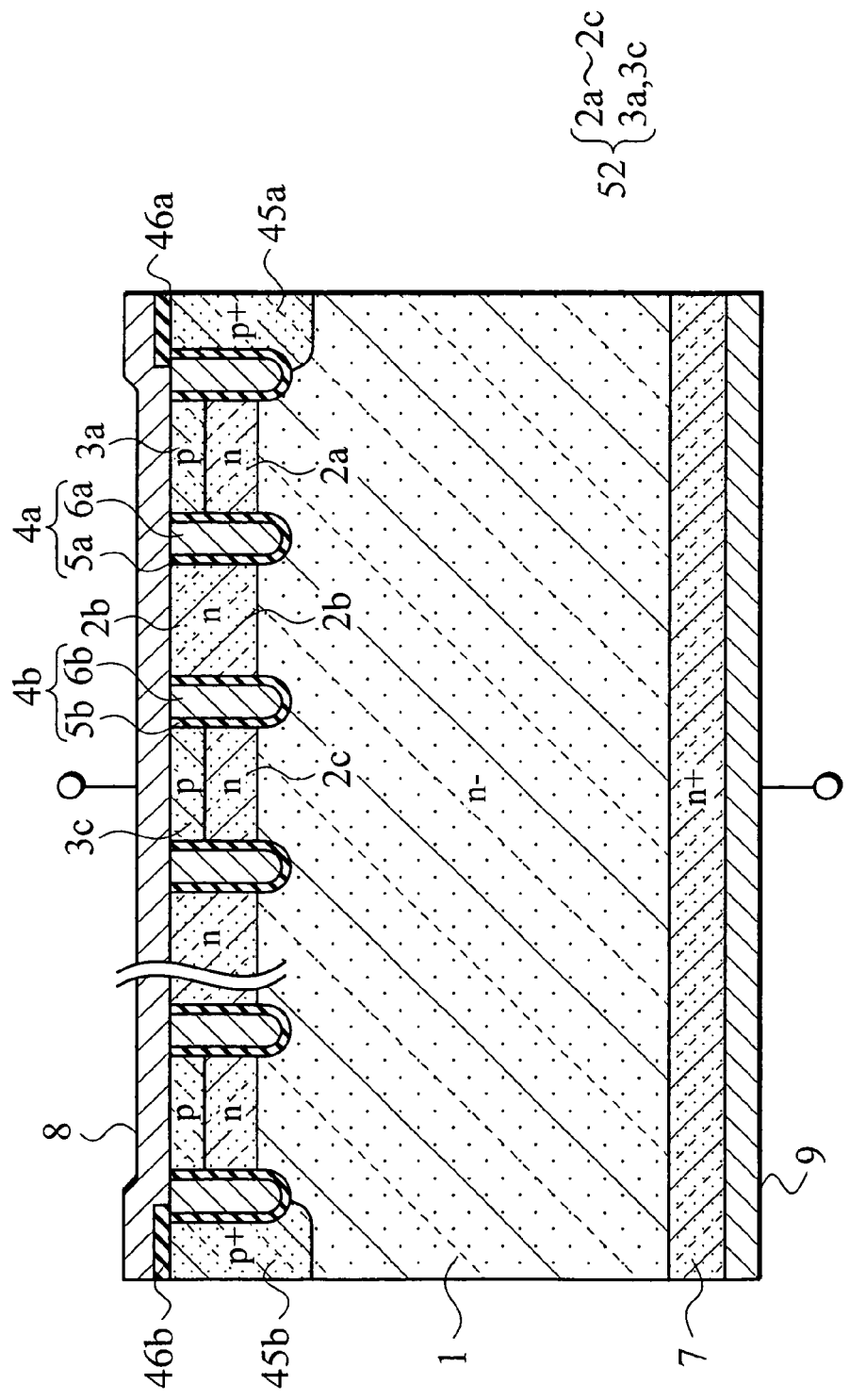
FIG. 14 is a cross-sectional, view of a semiconductor power device according to a third embodiment of the present invention.

As is shown in FIG. 14, a semiconductor power device according to a third embodiment includes a base layer 1 which has a first main surface and a second main surface opposite the first main surface, an anode layer 52 connected to the first main surface of the base layer 1, control regions 4a and 4b arranged inside the grooves that penetrate the anode layer 52 and reach inside the base layer 1, a cathode layer 7 connected to the second main surface of the base layer 1, an anode electrode 8 connected to the anode layer 52, a cathode electrode 9 connected to the cathode layer 7, ring regions 45a and 45b arranged along the outer walls of the control regions at both edges of the structure among the control regions 4a and 4b, and interlayer insulating films 46a and 46b respectively located between the ring regions 45a and 45b and the anode electrode 8.

The anode layer 52 includes barrier layers 2a, 2b and 2c, which contact the first main surface of the base layer 1, and anode regions 3a and 3b selectively arranged in the barrier layers 2a, 2b and 2c. The anode electrode 8 is ohmic-contacted to the anode regions 3a and 3c and Schottky-contacted to the barrier layer 2b. The control regions 4a and 4b respectively contact the barrier layers 2a and 2b, and 2b and 2c, and the anode regions 3a and 3c. Although not shown, the ring regions 45a and 45b are electrically connected to the anode regions 3a, 3b and 3c. Therefore, the ring regions 45a and 45b are connected to the anode electrode 8 through the anode regions 3a, 3b and 3c.

The control regions 4a and 4b respectively include control insulating films 5a and 5b arranged along the sides and bottoms of the grooves, and conductor regions 6a and 6b arranged inside the control insulating films 5a and 5b. The conductor regions 6a and 6b are connected to the anode electrode 8.

Figure 15:
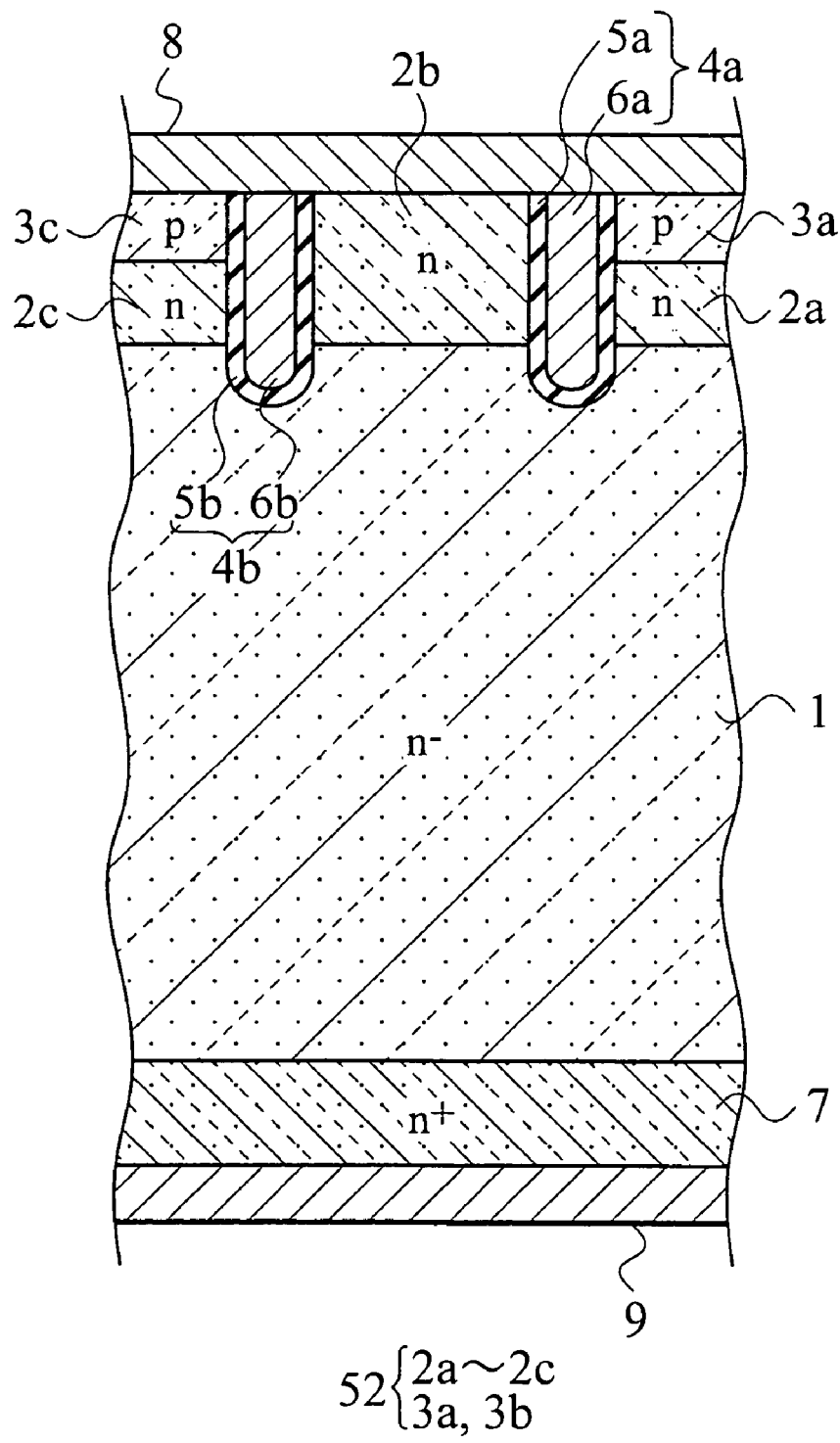
FIG. 15 is an enlarged cross-sectional view, taken along line XV—XV in FIG. 16, of a part of the semiconductor power device in FIG. 14.

As is shown in FIG. 15, the anode layer 52 is located on the first main surface of the base layer 1, and the cathode layer 7 is arranged on the second main surface. The anode layer 52 includes barrier layers 2a, 2b and 2c which contact the first main surface, and anode regions 3a and 3c which are selectively arranged on the barrier layers 2a and 2c, respectively. The control regions 4a and 4b are respectively arranged inside the grooves that penetrate the anode regions 3a and 3c and the barrier layers 2a, 2b and 2c and that approach the base layer 1 to a specific depth. The control insulating films 5a and 5b are thin films formed along the bottoms and sides of the grooves. The conductor regions 6a and 6b are respectively embedded in the grooves via the control insulating films 5a and 5b. The anode electrode 8 is ohmic-contacted to the anode regions 3a and 3c and the conductor regions 6a and 6b, and is Schottky-contacted to the barrier layer 2b. The cathode electrode 9 is connected to the cathode layer 7.

Figure 16:
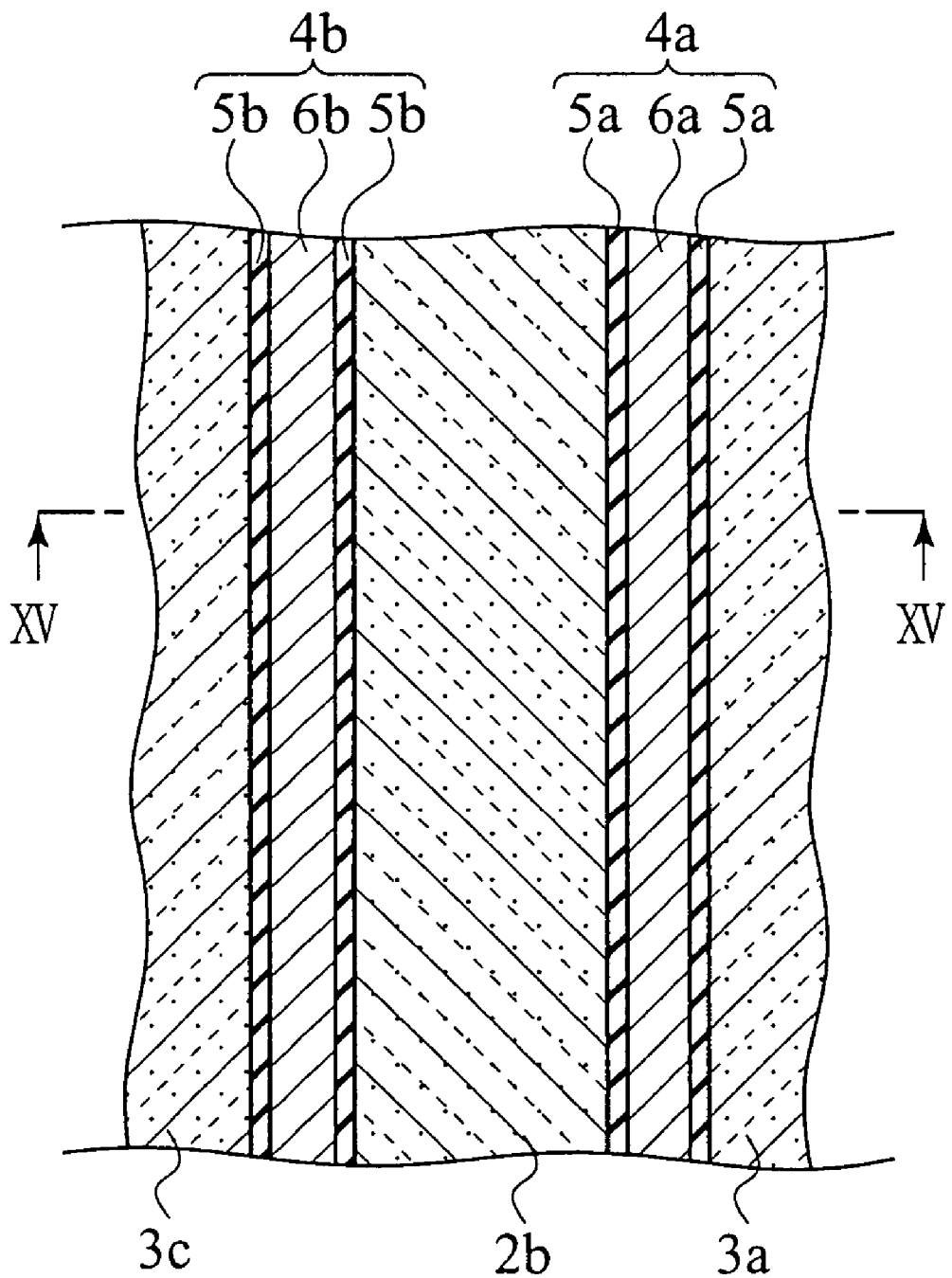
FIG. 16 is a diagram showing one part of a plane that contacts the anode electrode of the semiconductor power device in FIG. 14, while the anode electrode is not shown.

As is shown in FIG. 16, the anode regions 3a and 3c, the barrier layer 2b, the control insulating films 5a and 5b and the conductor regions 6a and 6b are exposed on the plane contacting the anode electrode 8. The control regions 4a and 4b are arranged such as stripes at a predetermined interval, and the control insulating films 5a and 5b are respectively arranged on both sides of the conductor regions 6a and 6b. The barrier layer 2b is located between the control regions 4a and 4b, and the anode regions 3a and 3c are respectively arranged outside the control regions 4a and 4b.

An explanation will now be given for the operations performed by the semiconductor power device shown in FIGS. 14 to 16 in the conductive state and in the reverse recovery condition. A positive voltage, relative to the cathode electrode 9, is applied to the anode electrode 8. This "positive voltage" is higher than the diffusion potential generated at the pn junctions between the barrier layer 2a and 2c and the anode region 3a and 3c, respectively. Then, holes are injected from the anode regions 3a and 3c to the barrier layers 2a and 2c, respectively. In accordance with the amount of injected holes, electrons are injected from the cathode layer 7 to the base layer 1. The carriers are accumulated in the base layer 1, and the resistance of the base layer 1 is reduced. Further, the electrons are discharged from the Schottky contact interface of the barrier layer 2b to the anode electrode 8. As a result, the semiconductor power device is rendered conductive, and a current flows from the anode electrode 8 to the cathode electrode 9.

An explanation will now be given for the reverse recovery processing for inverting the polarity of a voltage applied between the anode electrode 8 and the cathode electrode 9 in the conductive state. When a voltage applied in the conductive state is inverted, the carriers are discharged from the base layer 1, and depletion layers begin to spread out from the pn junctions between the barrier layers 2a and 2c and the anode regions 3a and 3c, respectively. Further a depletion layer begins to spread out from the Schottky contact interface between the barrier layer 2b and the anode electrode 8. As a result, a current flowing between the anode electrode 8 and the cathode electrode 9 is halted, and the semiconductor power device is set to the blocking state.

As is described above, since the barrier layers 2a and 2c are respectively formed between the anode regions 3a and 3c and the base layer 1, the number of holes injected into the base layer 1 from the anode regions 3a and 3c is limited. Therefore, in the conductive state, the number of carriers accumulated in the base layer 1 is reduced. As a result, for the semiconductor power device, the reverse recovery loss is reduced.

Further, since the conductor regions 6a and 6b are connected to the anode electrode 8, the potentials at the conductor regions 6a and 6b in the base layer 1 are equal to the potential at the anode electrode 8. Therefore, in the reverse recovery condition, depletion layers spread out from the portion of the base layer 1 that contacts the control regions 4a and 4b. Thus, the electric fields at the pn junctions of the anode regions 3a and 3c and the barrier layers 2a and 2c, respectively, and the electric field at the Schottky contact for the barrier layer 2b are reduced. The semiconductor power device ensures a satisfactory high breakdown voltage for the blocking state.

Furthermore, based on the MOS structure of the conductor regions 6a and 6b, the control insulating films 5a and 5b and the barrier layers 2a, 2b and 2c, an inversion layer is respectively formed on the barrier layers 2a, 2b and 2c contacting the control regions 4a and 4b in the reverse recovery condition. As a result, since holes are quickly discharged in the reverse recovery condition, the reverse recovery loss can be reduced.

In addition, since the ring regions 45a and 45b are provided, increase of the electric field at the edge of the control region 4a can be prevented. Further, since the ring regions 45a and 45b and the anode electrode 8 are not directly connected, the increase of a current at the ring regions 45a and 45b can be prevented. Therefore, the deterioration of the breakdown voltage in the reverse recovery condition can be prevented. It should be noted that, although not shown, the ring regions 45a and 45b are connected to the anode electrode 8 through the anode regions 3a, 3b and 3c.

Moreover, since the sizes of the anode regions 3a and 3c are smaller than those in the semiconductor power device in FIGS. 8 to 10, the number of holes injected into the base layer 1 from the anode regions 3a and 3c is further limited. Therefore, in the conductive state, the number of carriers accumulated in the base layer 1 is further reduced. As a result, the reverse recovery loss of the semiconductor power device can be further reduced.

Figure 17:
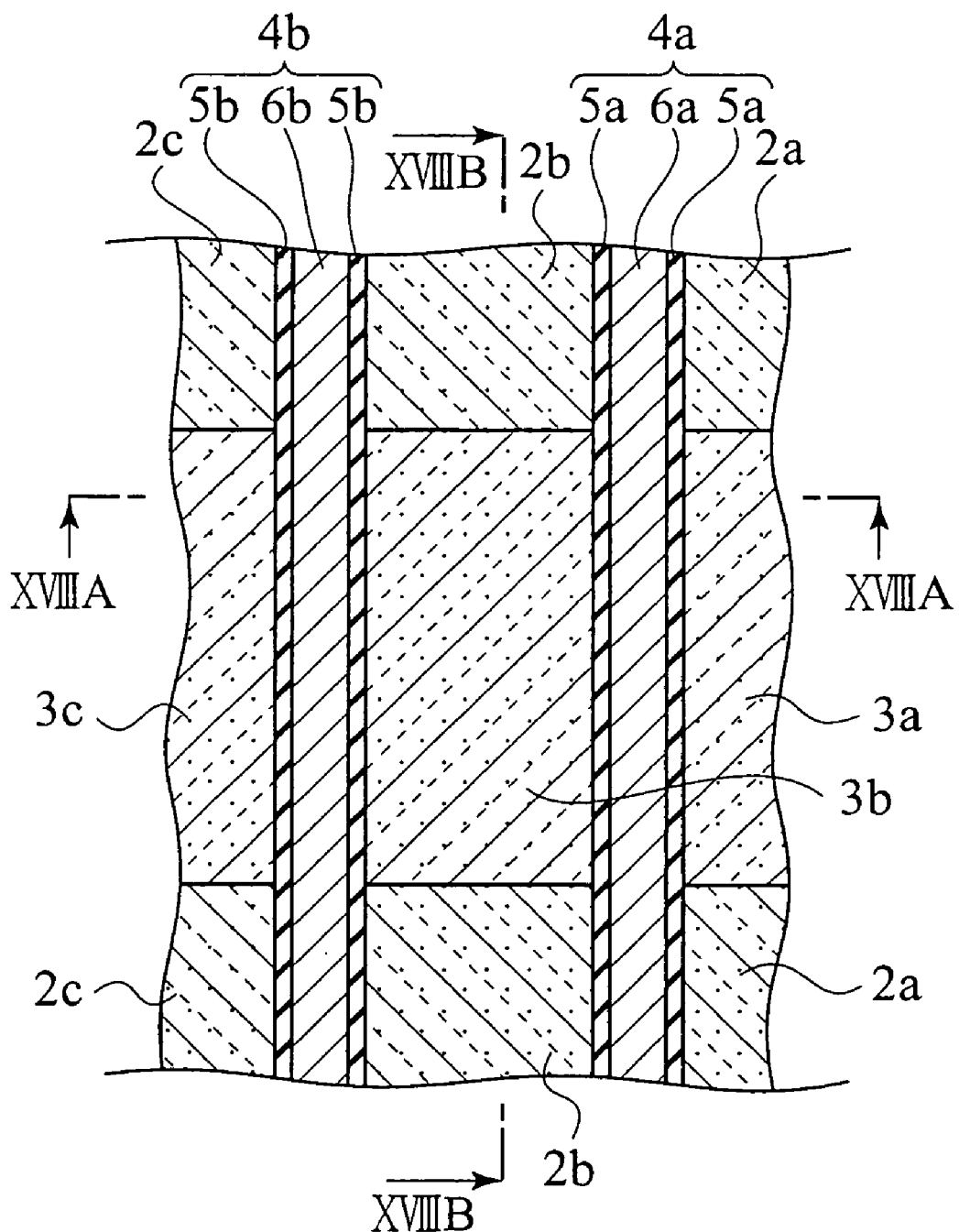
FIG. 17 is a plan view, for which an anode electrode is not shown, of a part of the semiconductor power device according to the third embodiment.

It should be noted that, as is shown in FIG. 17, anode regions 3a, 3b and 3c may be selectively arranged in one part of an area sandwiched by adjacent control regions 4a and 4b. That is, the barrier layers 2a, 2b and 2c may be located in the other part of the area sandwiched by the adjacent control regions 4a and 4b. A difference from the semiconductor power device in FIG. 16 is that the anode regions 3a, 3b and 3c are arranged such as stripes, perpendicular to the control regions 4a and 4b.

Figure 18A:
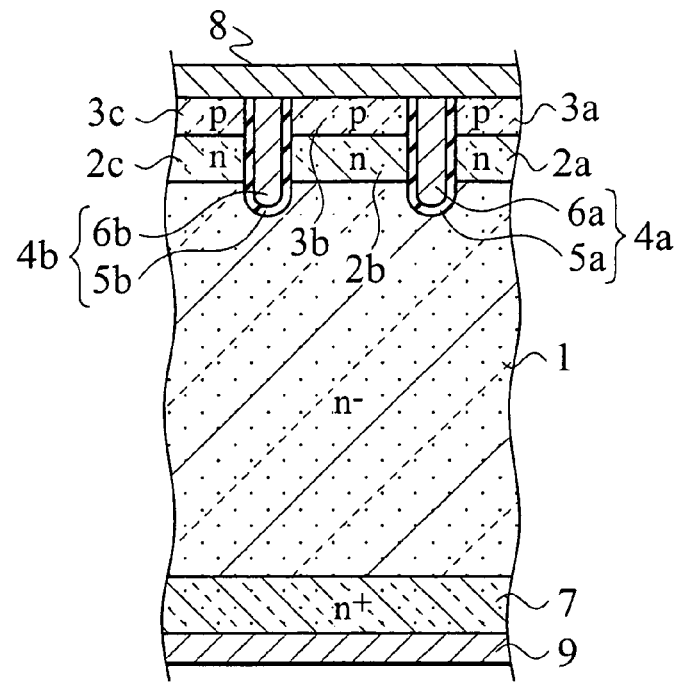
FIG. 18A is a cross-sectional view, taken along line XVIIIA—XVIIIA, of the semiconductor power device in FIG. 17.

As is shown in the cross section in FIG. 18A, taken along XVIIIA—XVIIIA in FIG. 17, the semiconductor power device shown in FIG. 17 includes a base layer 1 which has a first main surface and a second main surface opposite the first main surface, the barrier layers 2a, 2b and 2c connected to the first main surface of the base layer 1, the anode regions 3a, 3b and 3c selectively located in the barrier layers 2a, 2b and 2c, the control regions 4a and 4b arranged inside the grooves that penetrate the anode regions 3a, 3b and 3c and the barrier layers 2a, 2b and 2c, and reach inside the base layer 1, a cathode layer 7 connected to the second main surface of the base layer 1, an anode electrode 8 connected to regions 3a, 3b and 3c, and a cathode electrode 9 connected to the cathode layer 7.

Figure 18B:
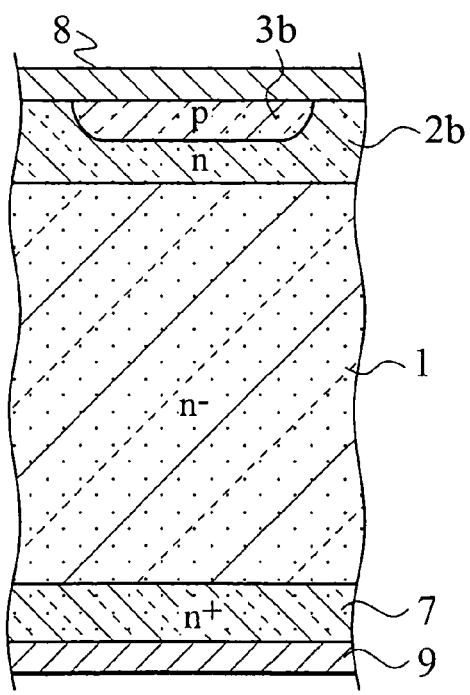
FIG. 18B is a cross-sectional view, taken along line XVIIIB—XVIIIB, of the semiconductor power device in FIG. 17.

As is shown in the cross section of FIG. 18B, taken along XVIIIB—XVIIIB in FIG. 17, the barrier layer 2b is formed on the first main surface of the base layer 1, and the anode region 3b is selectively arranged on the barrier layer 2b. The cathode layer 7 is located on the second main surface of the base layer 1 and is connected to the cathode electrode 9, and the anode region 3b and the barrier layer 2b are connected to the anode electrode 8.

Even when the mask alignment between the anode regions 3a, 3b and 3c and the control regions 4a and 4b is not accurate, the characteristic of the semiconductor power device will not be deteriorated.

First Modification of the Third Embodiment

Figure 19:
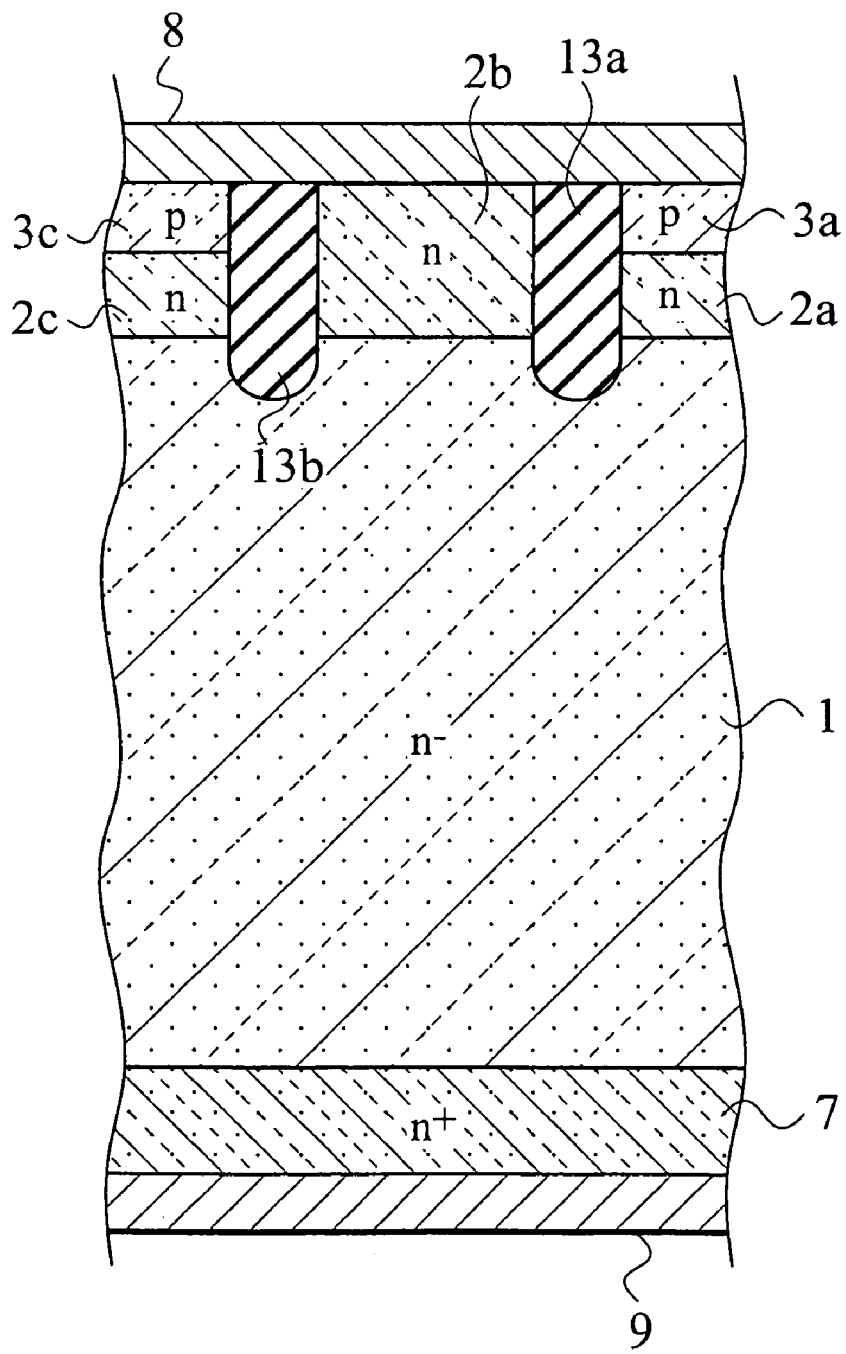
FIG. 19 is a cross-sectional view of a part of a semiconductor power device according to a first modification of the third embodiment.

As is shown in FIG. 19, a semiconductor power device according to a first modification of the third embodiment includes a base layer 1 which has a first main surface and a second main surface opposite the first main surface, an anode layer 52 connected to the first main surface of the base layer 1, insulator regions 13a and 13b located inside grooves that penetrate the anode layer 52 and reach inside the base layer 1, a cathode layer 7 connected to the second main surface of the base layer 1, an anode electrode 8 connected to the anode layer 52, and a cathode electrode 9 connected to the cathode layer 7. The anode layer 52 includes barrier layers 2a, 2b and 2c which contact the first main surface of the base layer 1, and anode regions 3a and 3c which are selectively arranged in the barrier layers 2a, 2b and 2c. The anode electrode 8 is Schottky-contacted to the barrier layer 2b, and is ohmic-contacted to the anode regions 3a and 3c. A difference from the semiconductor power device in FIG. 15 is that the insulator regions 13a and 13b, composed of an insulating material, are located inside the grooves.

Since the barrier layers 2a and 2c are respectively formed between the anode regions 3a and 3c and the base layer 1, the number of holes injected into the base layer 1 from the anode regions 3a and 3c is limited. Thus, the number of the carriers accumulated in the base layer 1 is reduced in the conductive state, and accordingly, the reverse recovery loss of the semiconductor power device is reduced.

Further, since the insulator regions 13a and 13b are arranged inside the grooves, the electric fields are increased in the bottoms of the grooves in the reverse recovery condition. Therefore, the electric fields at the pn junctions of the anode regions 3a and 3c and the barrier layers 2a and 2c are reduced, respectively. The electric field at the Schottky contact for the barrier layer 2b is reduced. As a result, in the reverse recovery condition, depletion layers spread out from the portion of the base layer 1 contacting the insulator regions 13a and 13b, and the semiconductor power device ensures a satisfactory high breakdown voltage for the reverse recovery. Thus, an avalanche yield seldom occurs, and a failure of the semiconductor power device during a reverse recovery can be avoided.

Second Modification of the Third Embodiment

Figure 20:
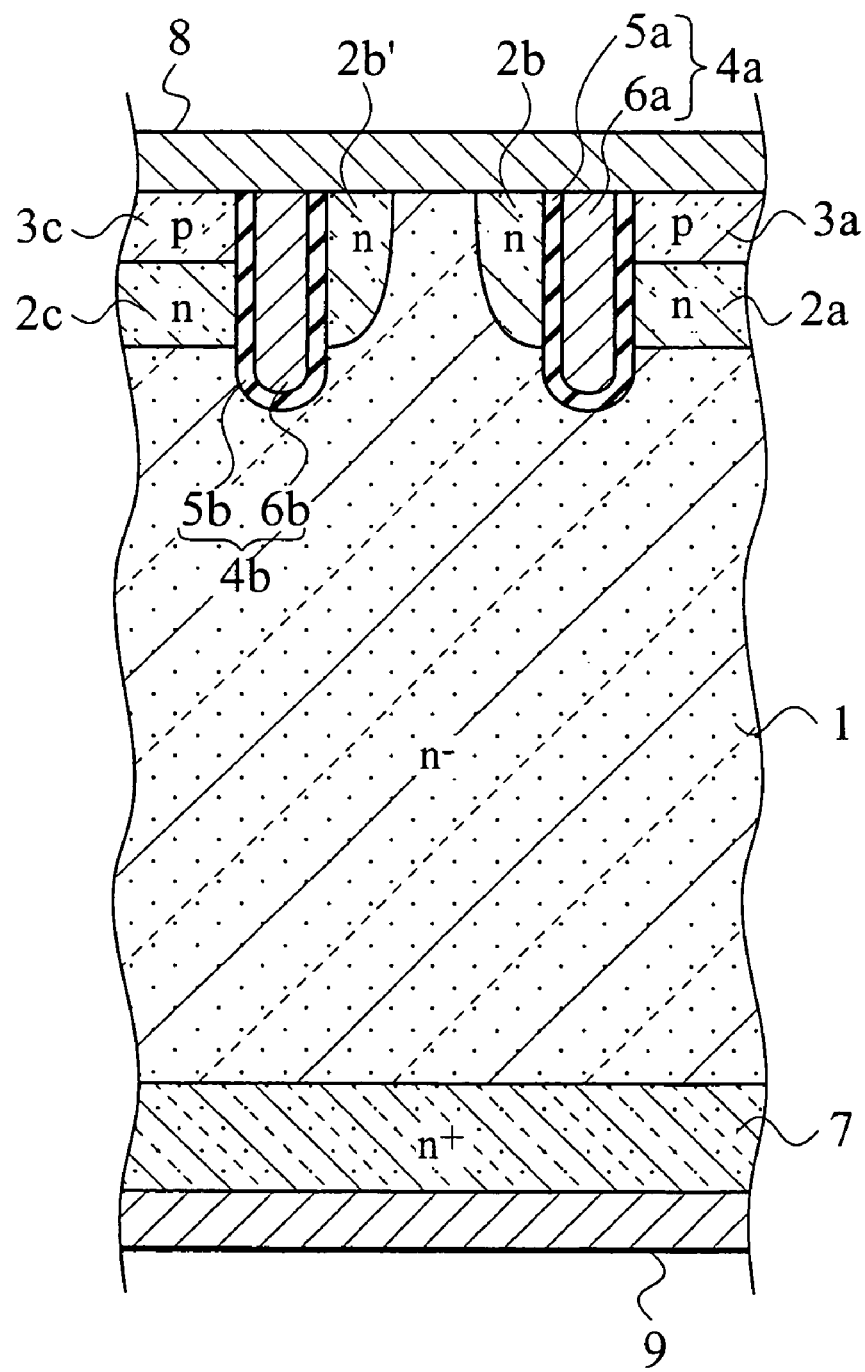
FIG. 20 is a cross-sectional view of a part of a semiconductor power device according to a second modification of the third embodiment.

As is shown in FIG. 20, a semiconductor power device according to a second modification of the third embodiment includes a base layer 1 which has a first main surface and a second main surface opposite the first main surface, an anode layer 52 selectively arranged in the upper portion of the base layer 1 that includes the first main surface, control regions 4a and 4b located inside the grooves that penetrate the anode layer 52 and reach inside the base layer 1, a cathode layer 7 that contacts the second main surface of the base layer 1, an anode electrode 8 connected to the anode layer 52 and the base layer 1, and a cathode electrode 9 connected to the cathode layer 7. The anode layer 52 includes barrier layers 2a, 2b, 2c and 2b' which contact the base layer 1, and anode regions 3a and 3c which are selectively arranged on the barrier layers 2a and 2c, respectively. The control regions 4a and 4b respectively include control insulating films 5a and 5b which are arranged along the sides and the bottoms of the grooves, and conductor regions 6a and 6b which are arranged inside the control insulating films 5a and 5b.

The anode electrode 8 is Schottky-contacted to the barrier layers 2b and 2b' and the base layer 1, and is ohmic-contacted to the anode regions 3a and 3c. While along the sides of the grooves, the control insulating films 5a and 5b respectively contact the barrier layers 2a and 2b and 2c and 2b', and the anode regions 3a and 3c. The conductor regions 6a and 6b are connected to the anode electrode 8. Differences from the semiconductor power device in FIG. 15 are that the barrier layers 2b and 2b' are arranged along the sides of the control insulating films 5a and 5b. Further, one part of the base layer 1, positioned between the barrier layers 2b and 2b', is Schottky-contacted to the anode electrode 8.

While the barrier layers 2a, 2b and 2c in FIG. 15 are formed by using the epitaxial growth method, the barrier layers 2a, 2b, 2c and 2b' in FIG. 20 may be formed by the diffusion method. Therefore, the manufacturing process is simplified.

Further, since the barrier layers 2a and 2c are respectively formed between the anode regions 3a and 3c and the base layer 1, the number of holes injected into the base layer 1 from the anode regions 3a and 3c is limited. Therefore, the number of carriers accumulated in the base layer 1 in the conductive state is reduced, and accordingly, the reverse recovery loss of the semiconductor power device is reduced.

In addition, since the conductor regions 6a and 6b are connected to the anode electrode 8, the potentials of the conductor regions 6a and 6b arranged in the base layer 1 are equal to the potential of the anode electrode 8. Accordingly, in the reverse recovery condition, depletion layers spread out from the portion of the base layer 1 contacting the control regions 4a and 4b. Therefore, the electric fields at the pn junctions of the anode regions 3a and 3c and the barrier layers 2a and 2c are reduced. Further, the electric field at the Schottky contact interface for the barrier layers 2b and 2b' and the base layer 1 is reduced. The semiconductor power device ensures a satisfactory high breakdown voltage during the reverse recovery.

Third Modification of the Third Embodiment

Figure 21:
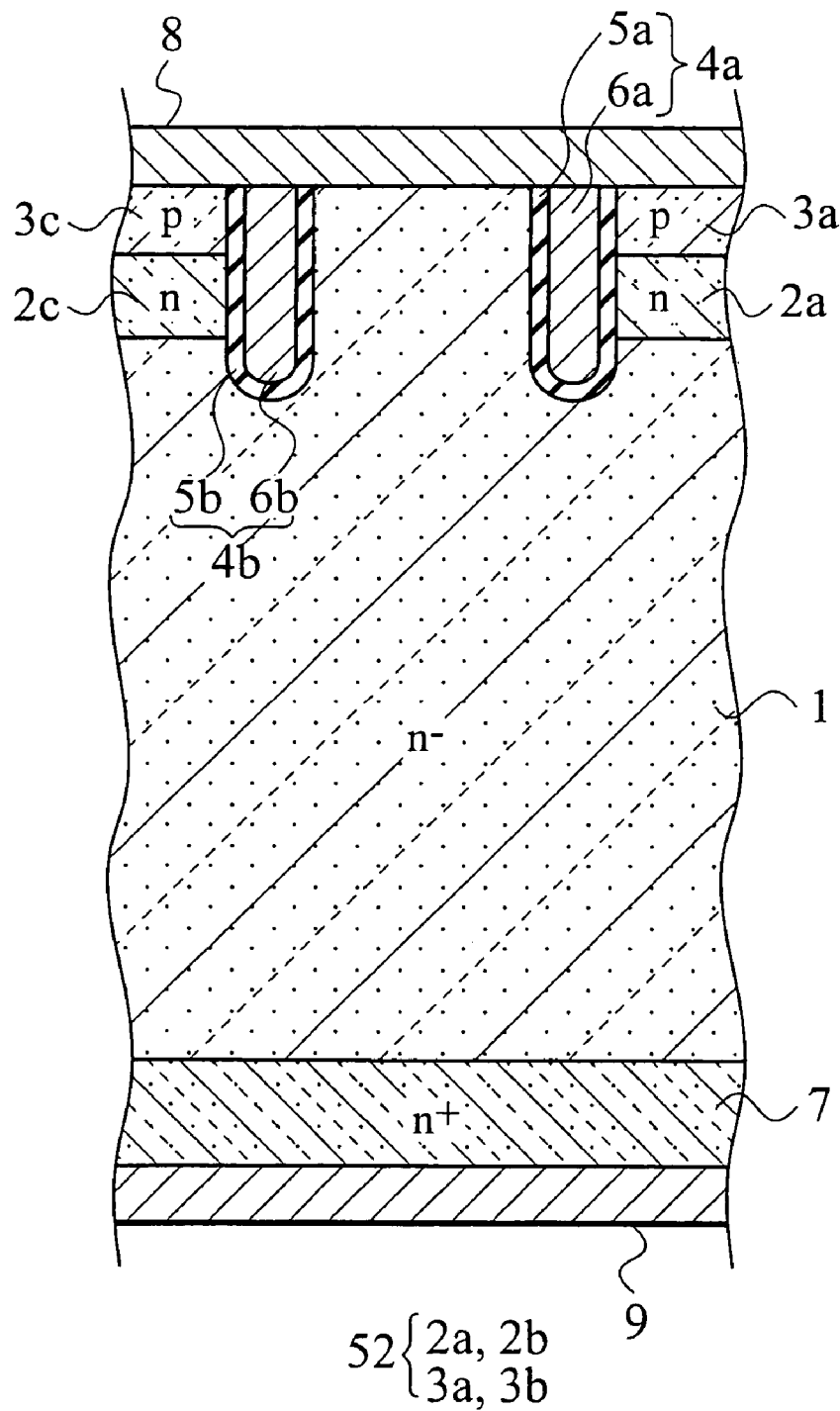
FIG. 21 is a cross-sectional view of a part of a semiconductor power device according to a third modification of the third embodiment.

As is shown in FIG. 21, a semiconductor power device according to a third modification of the third embodiment includes a base layer 1 which has a first main surface and a second main surface opposite to the first main surface, an anode layer 52 selectively arranged in the upper portion of the base layer 1 including the first main surface, control regions 4a and 4b located inside grooves that penetrate the anode layer 52 and reach inside the base layer 1, a cathode layer 7 which contacts the second main surface of the base layer 1, an anode electrode 8 connected to the anode layer 52 and the base layer 1, and a cathode electrode 9 connected to the cathode layer 7. The anode layer 52 includes barrier layers 2a and 2c which contact the base layer 1, and anode regions 3a and 3c respectively arranged on the barrier layers 2a and 2c. The control regions 4a and 4b respectively include control insulating films 5a and 5b located along the sides and bottoms of the grooves, and conductor regions 6a and 6b arranged inside the control insulating films 5a and 5b.

The anode electrode 8 is Schottky-contacted to the first main surface of the base layer 1, and is ohmic-contacted to the anode regions 3a and 3c. Along the sides of the grooves, the control insulating films 5a and 5b respectively contact the barrier layers 2a and 2c and the anode regions 3a and 3c.

The conductor regions 6a and 6b are connected to the anode electrode 8. A difference from the semiconductor power device in FIG. 15 is that only the base layer 1 is located between the control insulating films 5a and 5b, and the anode layer 52 is not provided.

Since the barrier layers 2b and 2b' shown in FIG. 20, which have an n-type impurity concentration higher than the base layer 1, are not provided, the n-type impurity concentration at the Schottky contact interface between the base layer 1 and the anode electrode 8 can be reduced, and the Schottky contact can be easily formed.

Furthermore, since the barrier layers 2a and 2c are respectively formed between the anode regions 3a and 3c and the base layer 1, the number of holes injected into the base layer 1 from the anode regions 3a and 3c can be limited. Therefore, in the conductive state, the number of carriers accumulated in the base layer 1 is reduced, and accordingly, the reverse recovery loss of the semiconductor power device is reduced.

In addition, since the conductor regions 6a and 6b are connected to the anode electrode 8, the potentials of the conductor regions 6a and 6b arranged in the base layer 1 are equal to the potential of the anode electrode 8, so that in the reverse recovery condition, depletion layers spread out from the portion of the base layer 1 contacting the control regions 4a and 4b. Therefore, the electric fields at the pn junctions between the anode regions 3a and 3c and the barrier layers 2a and 2c are reduced. Further, the electric field at the Schottky contact interface between the base layer 1 and the anode electrode 8 is reduced. The semiconductor power device ensures a satisfactory high breakdown voltage during the reverse recovery.

FOURTH EMBODIMENT

Figure 22:
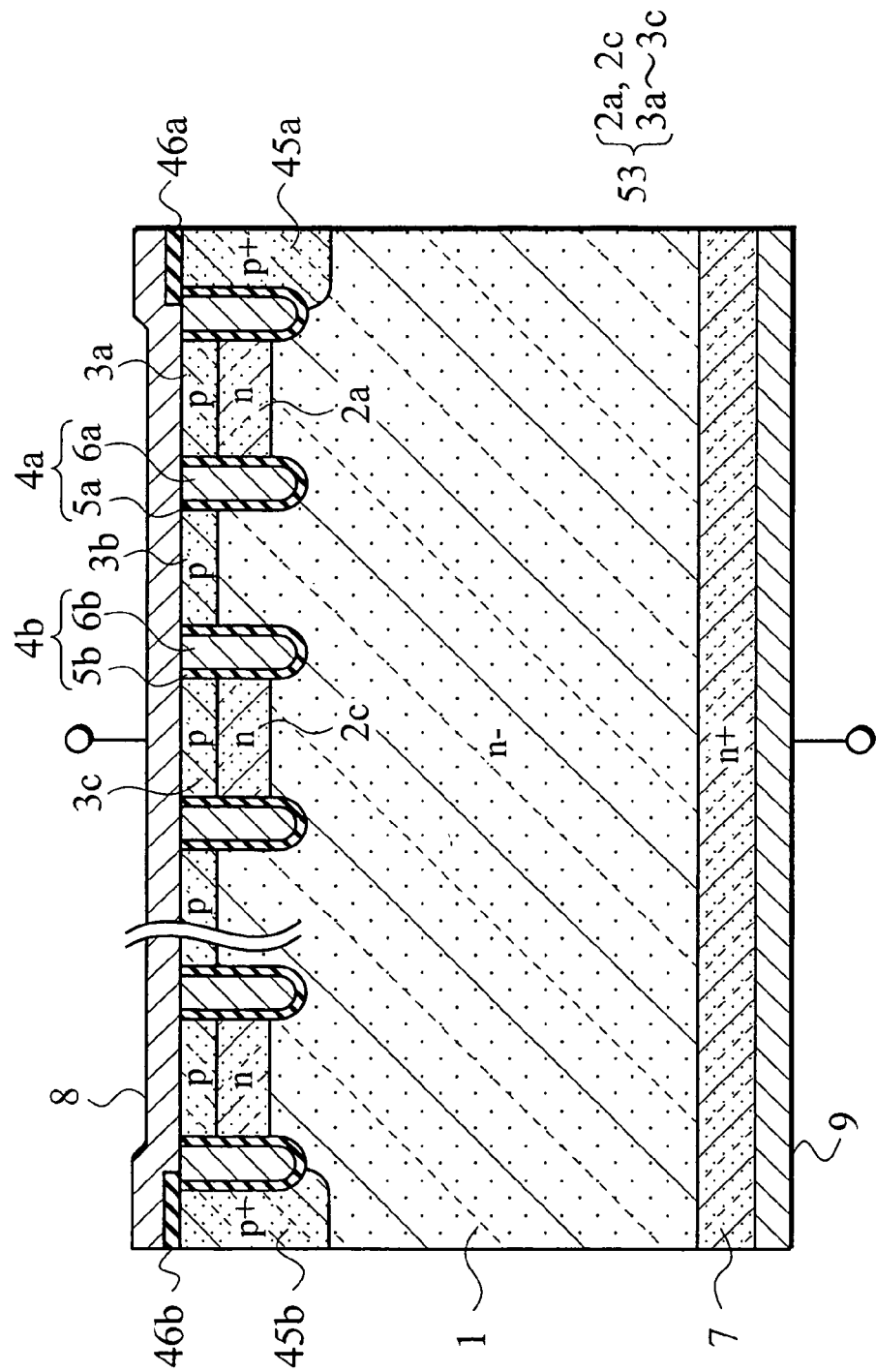
FIG. 22 is a cross-sectional, view of a semiconductor power device according to a fourth embodiment of the present invention.

As is shown in FIG. 22, a semiconductor power device according to a fourth embodiment of the present invention includes a base layer 1 which has a first main surface and a second main surface opposite the first main surface, an anode layer 53 connected to the first main surface of the base layer 1, control regions 4a and 4b arranged in grooves that penetrate the anode layer 53 and reach inside the base layer 1, a cathode layer 7 connected to the second main surface of the base layer 1, an anode electrode 8 connected to the anode layer 53, a cathode electrode 9 connected to the cathode layer 7, ring regions 45a and 45b respectively arranged along the outer wall of the control regions located at both edges of the structure among the control region 4a and 4b, and interlayer insulating films 46a and 46b respectively located between the ring regions 45a and 45b and the anode electrode 8.

The anode layer 53 includes barrier layers 2a and 2c which contact the first main surface of the base layer 1, and the anode regions 3a, 3b and 3c which are selectively arranged in the barrier layers 2a and 2c. The anode electrode 8 is ohmic-contacted to the anode regions 3a, 3b and 3c. The anode region 3b contacts the main first surface of the base layer 1. The control regions 4a and 4b respectively contact the barrier layers 2a and 2c and the anode regions 3a and 3b, and 3b and 3c. It should be noted that, although not shown, the ring regions 45a and 45b are connected to the anode electrode 8 through the anode regions 3a, 3b, 3c and 3d.

The control regions 4a and 4b respectively include control insulating films 5a and 5b which are arranged along the sides and bottoms of the grooves, and conductor regions 6a and 6b which are arranged inside the control insulating films 5a and 5b. The conductor regions 6a and 6b are connected to the anode electrode 8.

Figure 23:
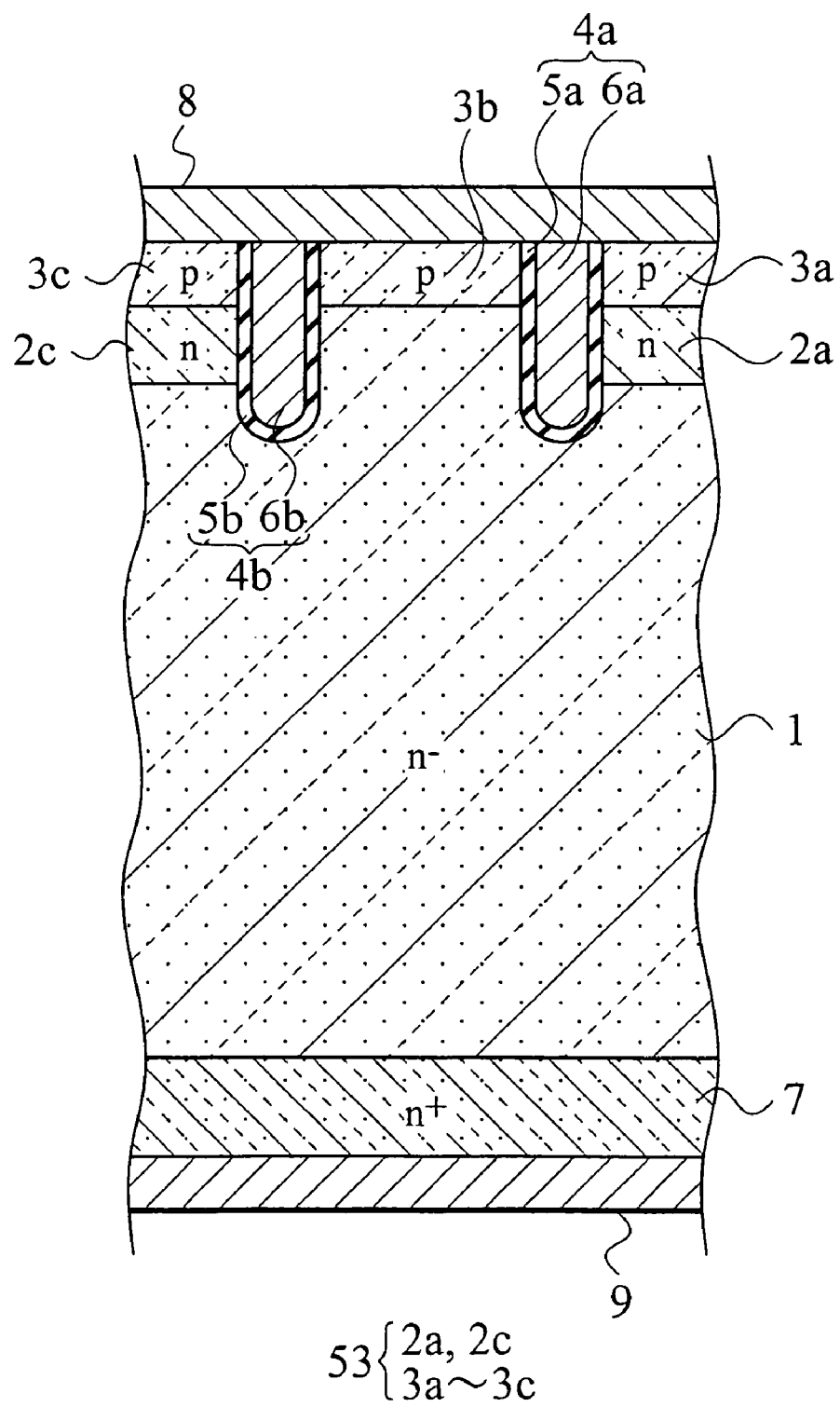
FIG. 23 is an enlarged cross-sectional view, taken along line XXIII—XXIII in FIG. 24, of the semiconductor power device in FIG. 22.

As is shown in FIG. 23, the anode layer 53 is located on the first main surface of the base layer 1, and the cathode layer 7 is located on the second main surface. The anode layer 53 includes the barrier layers 2a and 2c which contact the first main surface, the anode regions 3a and 3c selectively arranged on the barrier layers 2a and 2c, respectively, and the anode region 3b which contacts the first main surface. The control regions 4a and 4b are respectively arranged in the grooves that penetrate the anode regions 3a, 3b and 3c and the barrier layers 2a and 2c, and approach the base layer 1 to a specific depth. The control insulating films 5a and 5b are thin films provided along the bottoms and sides of the grooves, and the conductor regions 6a and 6b are relatively arranged so that they are embedded in the grooves via the control insulating films 5a and 5b. The anode electrode 8 is connected to the anode regions 3a, 3b and 3c and the conductor regions 6a and 6b. The cathode electrode 9 is connected to the cathode layer 7. The anode region 3b, which contacts the base layer 1, is selectively arranged in one part of an area sandwiched between the adjacent control regions 4a and 4b.

Figure 24:
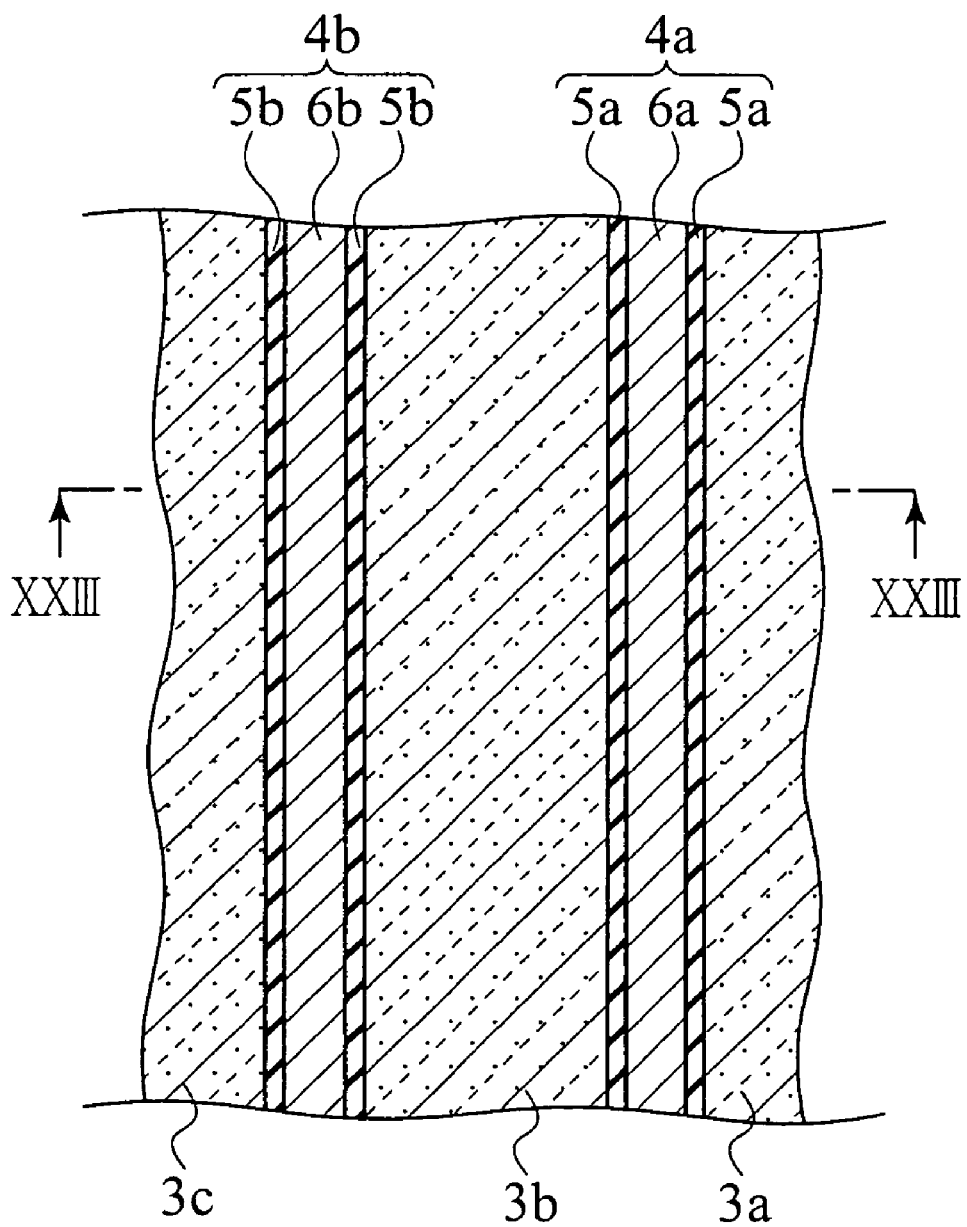
FIG. 24 is a diagram showing a part of the plane of the semiconductor power device in FIG. 22 that contacts an anode electrode, which is not shown.

As is shown in FIG. 24, the anode regions 3a, 3b and 3c, the control insulating films 5a and 5b and the conductor regions 6a and 6b are exposed on the plane contacting the anode electrode 8. The control regions 4a and 4b are arranged such as stripes at a predetermined interval. The control insulating films 5a and 5b are respectively arranged on both sides of the conductor regions 6a and 6b. The anode region 3b is located between the control regions 4a and 4b, and the anode regions 3a and 3b are respectively located outside the control regions 4a and 4b.

An explanation will now be given for the operation of the semiconductor power device in FIGS. 22 to 24 in the conductive state and in the reverse recovery condition. A positive voltage, relative to the cathode electrode 9, is applied to the anode electrode 8. The "positive voltage" is higher than the diffusion potentials generated at the pn junctions between the barrier layers 2a and 2c and the anode regions 3a and 3c, respectively, and the diffusion potential at the pn junction between the anode region 3b and the base layer 1. Then, holes are injected into the barrier layers 2a and 2c from the anode regions 3a and 3c, respectively, and are also injected into the base layer 1 from the anode region 3b. In accordance with the number of injected holes, electrons are injected into the base layer 1 from the cathode layer 7. The carriers are accumulated in the base layer 1, and the resistance of the base layer 1 is reduced. As a result, the semiconductor power device is rendered conductive, and a current flows from the anode electrode 8 to the cathode electrode 9.

An explanation will now be given for the reverse recovery process for inverting the polarity of the voltage applied between the anode electrode 8 and the cathode electrode 9 in the conductive state. When a voltage applied in the conductive state is inverted, the carriers are discharged from the base layer 1, and depletion layers begin to spread out from the pn junctions between the barrier layers 2a and 2c and the anode regions 3a and 3c, respectively, and from the pn junction between the anode region 3b and the base layer 1. As a result, a current flowing between the anode electrode 8 and the cathode electrode 9 is halted, and the semiconductor power device is set to the blocking state.

As is described above, since the barrier layers 2a and 2c are respectively formed between the anode regions 3a and 3c and the base layer 1, the number of holes injected into the base layer 1 from the anode regions 3a and 3c is limited. Therefore, in the conductive state, the number of carriers accumulated in the base layer 1 is reduced, and accordingly, the reverse recovery loss of the semiconductor power device is reduced.

Further, when the sizes of the barriers 2a and 2c are controlled, the number of holes to be injected into the base layer 1 can be adjusted.

In addition, since the conductor regions 6a and 6b are connected to the anode electrode 8, the potentials of the conductor regions 6a and 6b in the base layer 1 are equal to the potential of the anode electrode 8, so that the depletion layers spread out from the portion of the base layer 1 contacting the control regions 4a and 4b. Thus, the electric fields at the pn junctions between the anode regions 3a and 3c and the barrier layers 2a and 2c are reduced, respectively. The electric field at the pn junction between the anode region 3b and the base layer 1 is reduced. The semiconductor power device ensures a satisfactory high breakdown voltage during the reverse recovery.

Furthermore, based on the MOS structure of the conductor regions 6a and 6b, the control insulating films 5a and 5b and the barrier layers 2a and 2c, in the reverse recovery condition, an inversion layer is formed for the barrier layers 2a and 2c and the base layer 1 contacting the control regions 4a and 4b, respectively. As a result, since the holes are quickly discharged in the reverse recovery condition, the reverse recovery loss can be further reduced.

Moreover, since the ring regions 45a and 45b are provided, increase of the electric fields at the edges of the control region 4a can be prevented. Since the ring regions 45a and 45b and the anode electrode 8 are not directly connected, increase of a current at the ring regions 45a and 45b can be prevented. As a result, during the reverse recovery, thermal destruction can be avoided.

It is preferable that the ratio of the size of the anode region 3b contacting the base layer 1 should be equal to or smaller than 10% of the total size of the anode regions 3a, 3b and 3c. The ratio of 10% or smaller can be implemented by adjusting the ratio whereat the anode region 3b contacting the base layer 1 is located in the area between the control regions 4a and 4b, or by adjusting the gap width between the control regions 4a and 4b wherein the anode region 3b is formed.

First Modification of the Fourth Embodiment

Figure 25:
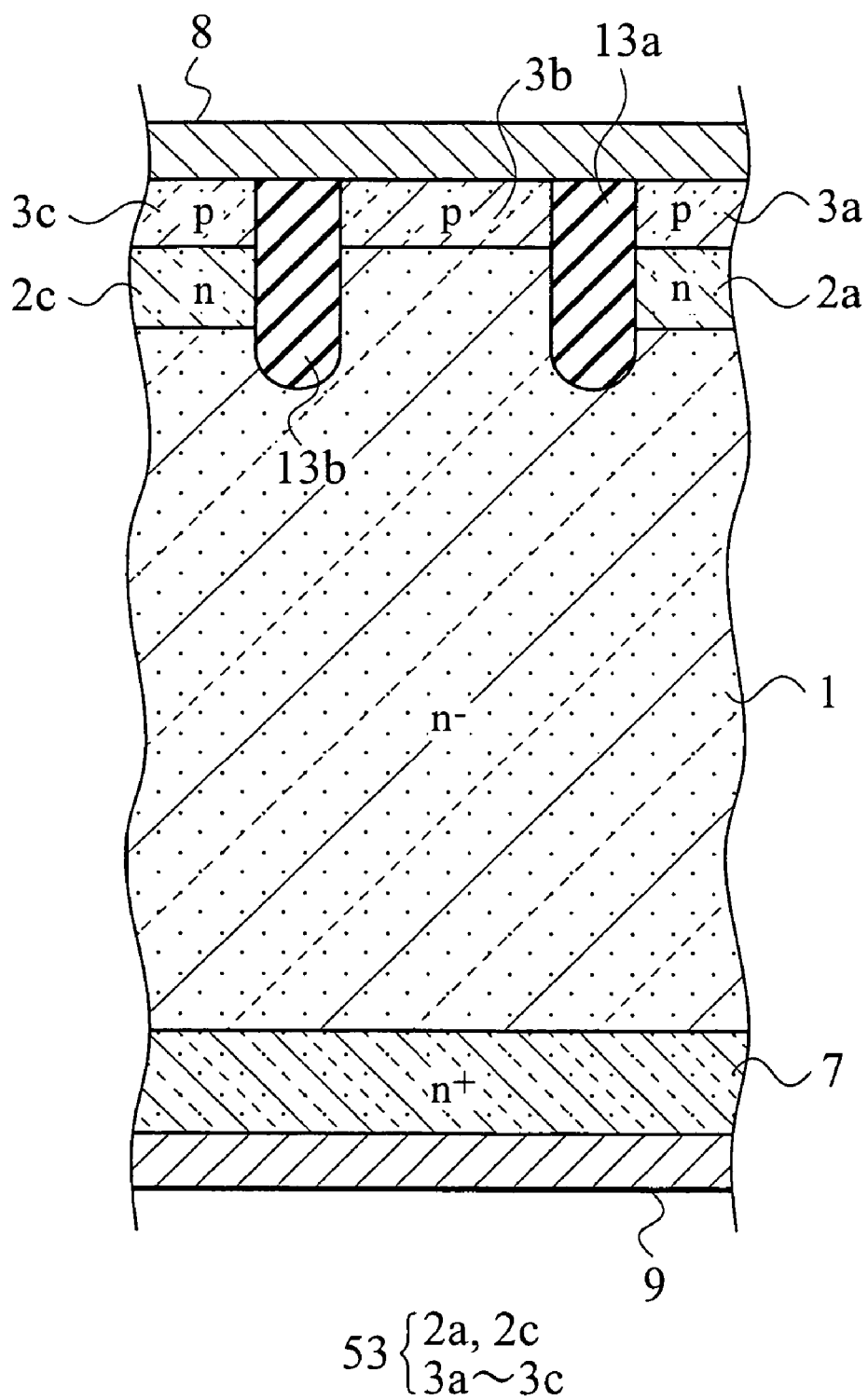
FIG. 25 is a cross-sectional view of a part of a semiconductor power device according to a first modification of the fourth embodiment.

As is shown in FIG. 25, a semiconductor power device according to a first modification of the fourth embodiment includes a base layer 1 which has a first main surface and a second main surface opposite the first main surface, an anode layer 53 connected to the first main surface of the base layer 1, insulator regions 13a and 13b arranged in grooves that penetrate the anode layer 53 and reach inside the base layer 1, a cathode layer 7 connected to the second main surface of the base layer 1, an anode electrode 8 connected to the anode layer 53 and a cathode electrode 9 connected to the cathode layer 7. The anode layer 53 includes barrier layers 2a and 2c and an anode region 3b that contact the first main surface of the base layer 1, and anode regions 3a and 3c that are selectively arranged on the barrier layers 2a and 2c. The anode electrode 8 is ohmic-contacted to the anode regions 3a, 3b and 3c, and the anode region 3b is connected to the first main surface of the base layer 1. A difference from the semiconductor power device in FIG. 23 is that the insulator regions 13a and 13b, composed of an insulating material, are provided inside the grooves.

Since the barrier layers 2a and 2c are respectively formed between the anode regions 3a and 3c and the base layer 1, the number of holes injected into the base layer 1 from the anode regions 3a and 3c is limited, so that, in the conductive state, the number of carriers accumulated in the base layer 1 is reduced. As a result, the reverse recovery loss of the semiconductor power device is reduced.

Further, since the insulator regions 13a and 13b are arranged inside the grooves, the electric fields are concentrated in the bottoms of the grooves in the reverse recovery condition. Therefore, the electric fields between the barrier layers 2a and 2c and the anode regions 3a and 3c are reduced, respectively. The electric field between the anode region 3b and the base layer 1 is reduced. Thus, in the reverse recovery condition, depletion layers spread out from the portion of the base layer 1 contacting the insulator regions 13a and 13b, and the semiconductor power device ensures a satisfactory high blocking voltage during the reverse recovery. As a result, an avalanche yield seldom occurs, and a reduction in the blocking voltage during a reverse recovery can be avoided.

Second Modification of the Fourth Embodiment

Figure 26:
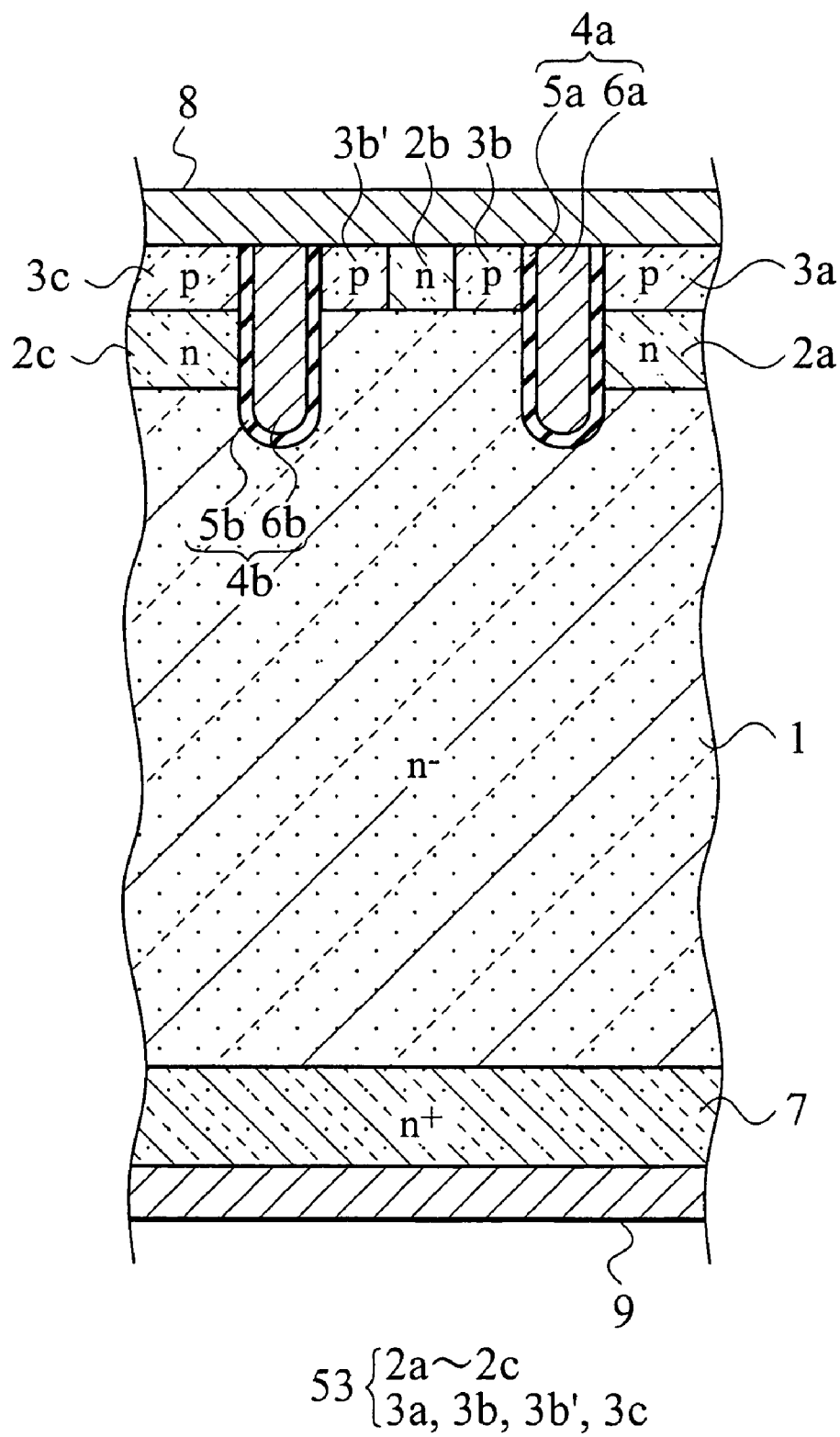
FIG. 26 is a cross-sectional view of a part of a semiconductor power device according to a second modification of the fourth embodiment.

As is shown in FIG. 26, a semiconductor power device according to a second modification of the fourth embodiment includes a base layer 1 which has a first main surface and a second main surface opposite the first main surface, an anode layer 53 connected to the first main surface of the base layer 1, control regions 4a and 4b arranged in grooves that penetrate the anode layer 53 and reach inside the base layer 1, a cathode layer 7 connected to the second main surface of the base layer 1, an anode electrode 8 connected to the anode layer 53, and a cathode electrode 9 connected to the cathode layer 7. The anode layer 53 include barrier layers 2a, 2b and 2c contacting the first main surface of the base layer 1, and anode regions 3a, 3b, 3b' and 3c selectively arranged in the barrier layers 2a, 2b and 2c. The control regions 4a and 4b include control insulating films 5a and 5b arranged along the sides and bottoms of the grooves, and conductor regions 6a and 6b arranged inside the control insulating films 5a and 5b, respectively. The conductor regions 6a and 6b are connected to the anode electrode 8. The anode electrode 8 is ohmic-contacted to the anode regions 3a, 3b, 3b' and 3c, and is Schottky-contacted to the barrier layer 2b. The anode regions 3b and 3b' are connected to the first main surface of the base layer 1. A difference from the semiconductor power device in FIG. 23 is that the anode regions 3b and 3b' are selectively located in the barrier layer 2b.

An explanation will now be given for the operations performed by the semiconductor power device in FIG. 26 in the conductive state and in the reverse recovery condition. A positive voltage relative to the cathode electrode 9 is applied to the anode electrode 8. The "positive voltage" is higher than the diffusion potential at the pn junctions between the barrier layers 2a and 2b and the anode regions 3a and 3c, respectively, the diffusion potential at the pn junction between the anode regions 3b and 3b' and the base layer 1. Then, holes are injected into the barrier layers 2a and 2c from the anode regions 3a and 3c and into the base layer 1 from the anode regions 3b and 3b', respectively. In consonance with the number of holes injected, electrons are injected into the base layer 1 from the cathode layer 7. Carriers are accumulated in the base layer 1, and the base layer 1 resistance is reduced. Furthermore, electrons are discharged from the Schottky contact interface of the barrier layer 2b to the anode electrode 8. The semiconductor power device is thereby rendered conductive, and a current flows from the anode electrode 8 to the cathode electrode 9.

An explanation will now be given for the reverse recovery processing for inverting the polarity of a voltage applied between the anode electrode 8 and the cathode electrode 9 in the conductive state. When the polarity of a voltage applied in the conductive state is inverted, the carriers are discharged from the base layer 1. The depletion layers spread out from the pn junctions between the barrier layers 2a and 2c and the anode regions 3a and 3c, respectively. The depletion layers also spread out from the pn junction interface between the anode regions 3b and 3b' and the base layer 1, and from the Schottky contact interface of the barrier layer 2b. As a result, a current does not flow between the anode electrode 8 and the cathode electrode 9, and the semiconductor power device is set in the blocking state.

As is described above, when the sizes of the barrier layers 2a, 2b and 2c and the sizes of the anode regions 3b and 3b' are controlled, the number of holes injected into the base layer 1 can be adjusted.

FIFTH EMBODIMENT

Figure 27:
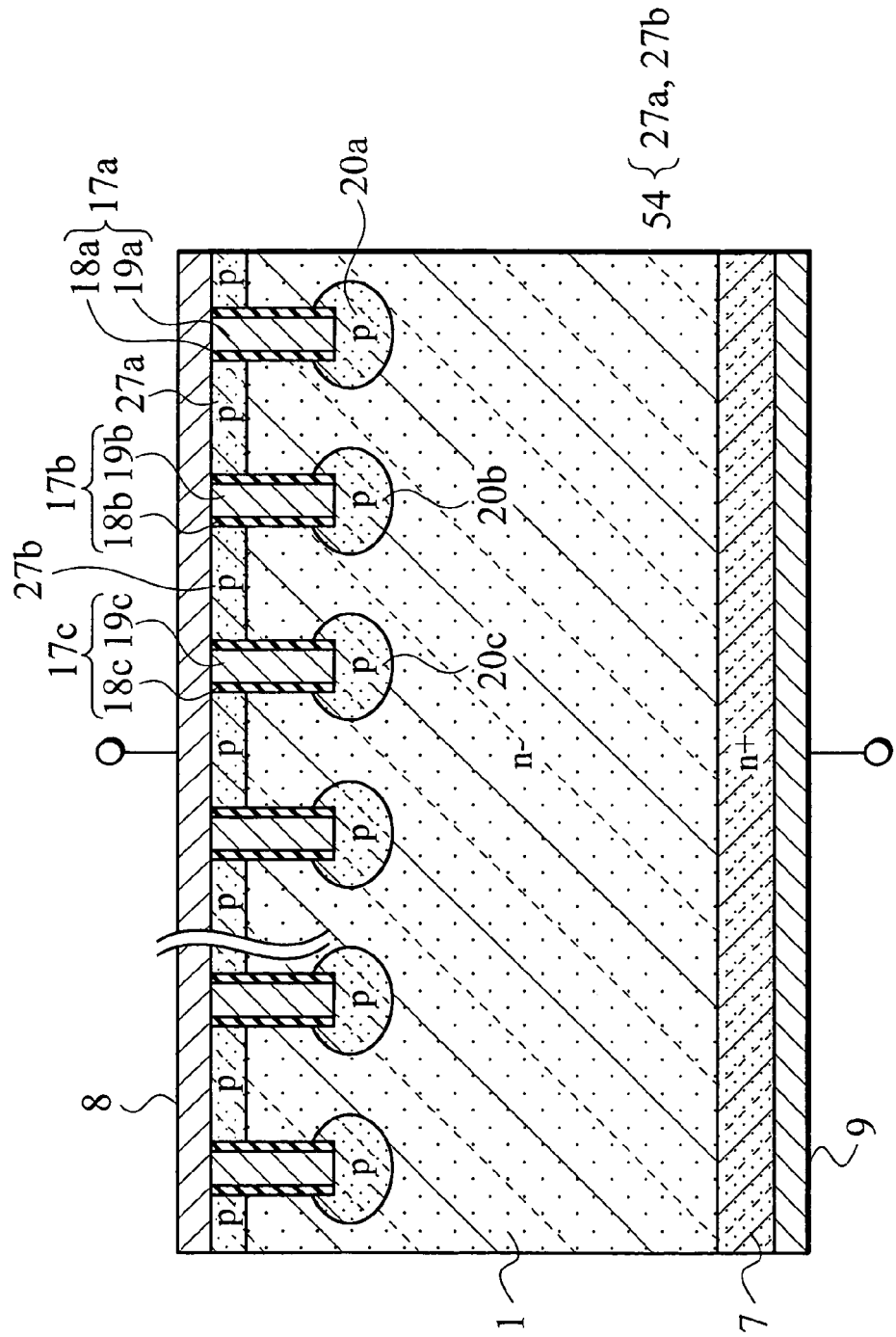
FIG. 27 is a cross-sectional, view of a semiconductor power device according to a fifth embodiment of the present invention.

As is shown in FIG. 27, a semiconductor power device according to a fifth embodiment of the present invention includes a base layer 1 which has a first main surface and a second main surface opposite the first main surface, an anode layer 54 connected to the first main surface of the base layer 1, control regions 17a, 17b and 17c arranged inside grooves that penetrate the anode layer 54 and reach inside the base layer 1, a cathode layer 7 connected to the second main surface of the base layer 1, sense regions 20a, 20b and 20c located inside the base layer 1 and respectively connected to the control regions 17a, 17b and 17c, an anode electrode 8 connected to the anode layer 54 and the control regions 17a, 17b and 17c, and a cathode electrode 9 connected to the cathode layer 7. The control regions 17a, 17b and 17c respectively include control insulating films 18a, 18b and 18c arranged along the sides of the grooves, and resistor regions 19a, 19b and 19c respectively located inside the control insulating films 18a, 18b and 18c. The resistor regions 19a, 19b and 19c are respectively connected to the sense regions 20a, 20b and 20c and the anode electrode 8. In the fifth embodiment, the anode region 54 includes anode regions 27a and 27b formed of p-type semiconductors. The sense regions 20a, 20b and 20c are also formed of p-type semiconductors.

Figure 28:
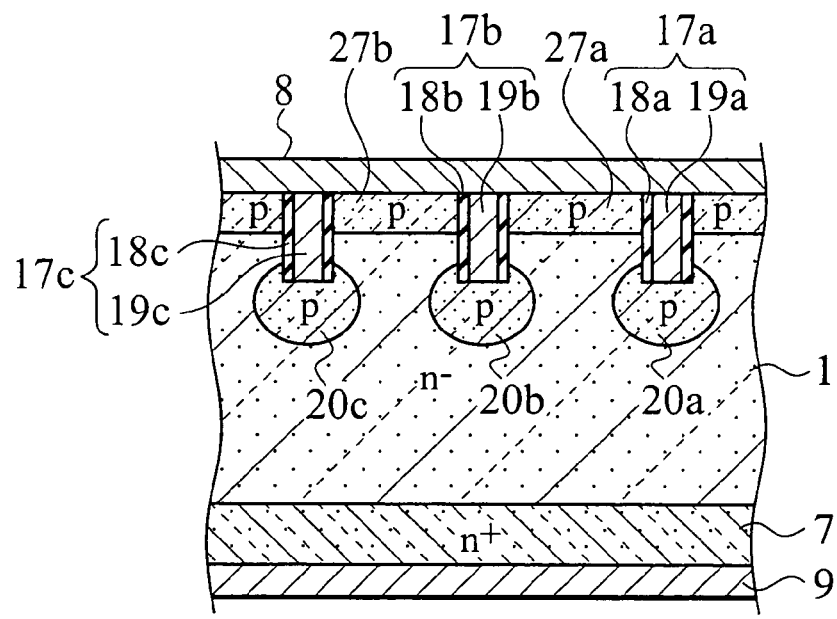
FIG. 28 is an enlarged cross-sectional view, taken along line XXVIII—XXVIII in FIG. 29, of the semiconductor power device in FIG. 27.

As is shown in FIG. 28, the anode regions 27a and 27b are arranged on the first main surface of the base layer 1, and the cathode layer 7 is arranged on the second main surface. The control regions 17a, 17b and 17c are located inside the grooves that penetrate the anode regions 27a and 27b and reach inside the base layer 1 to a specific depth. The control insulating films 18a, 18b and 18c are thin films arranged along the sides of the grooves, and the resistor regions 19a, 19b and 19c are respectively arranged to fill the grooves together with the control insulating films 18a, 18b and 18c. The anode electrode 8 is connected to the anode regions 27a and 27b and the resistor regions 19a, 19b and 19c. The cathode electrode 9 is connected to the cathode layer 7.

Figure 29:
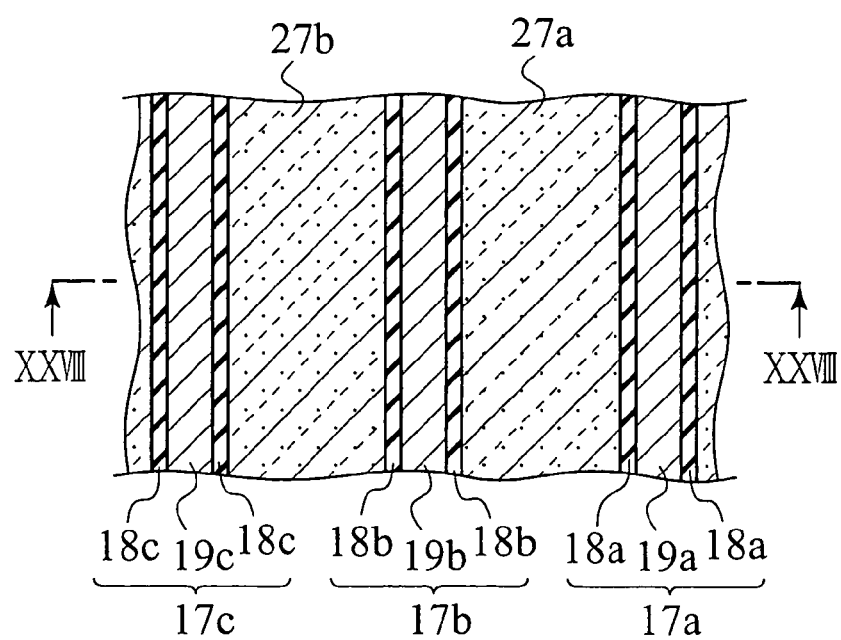
FIG. 29 is a diagram showing a part of the plane of the semiconductor power device in FIG. 27 that contacts an anode electrode, which is not shown.

As is shown in FIG. 29, the anode regions 27a and 27b, the control insulating films 18a, 18b and 18c and the resistor regions 19a, 19b and 19c are exposed on the plane that contacts the anode electrode 8. The control regions 17a, 17b and 17c are arranged such as stripes at a predetermined interval. The control insulating films 18a, 18b and 18c are respectively arranged on both sides of corresponding resistor regions 19a, 19b and 19c. The anode regions 27a and 27b are arranged within the control regions 17a, 17b and 17c.

An explanation will now be given for the operations performed by the semiconductor power device in FIGS. 27 to 29 in the conductive state and the reverse recovery condition. A positive voltage relative to the cathode electrode 9 is applied to the anode electrode 8. The "positive voltage" is higher than a diffusion potential at the pn junctions between the base layer 1 and the anode regions 27a and 27b. Then, holes are injected into the base layer 1 from the anode regions 27a and 27b. In accordance with the number of injected holes, electrons are injected into the base layer 1 from the cathode layer 7. The carriers are accumulated in the base layer 1, and the resistance of the base layer 1 is reduced. Thus, the semiconductor power device is rendered conductive, and a current flows from the anode electrode 8 to the cathode electrode 9.

An explanation will now be given for the reverse recovery processing for inverting the polarity of a voltage applied between the anode electrode 8 and the cathode electrode 9 in the conductive state. When a voltage applied in the conductive state is inverted, the carriers are discharged from the base layer 1, and depletion layers begin to spread out from the pn junctions between the base layer 1 and the anode regions 27a and 27b. As a result, a current flowing between the anode electrode 8 and the cathode electrode 9 is halted, and the semiconductor power device is set to the blocking state.

Figure 30A:
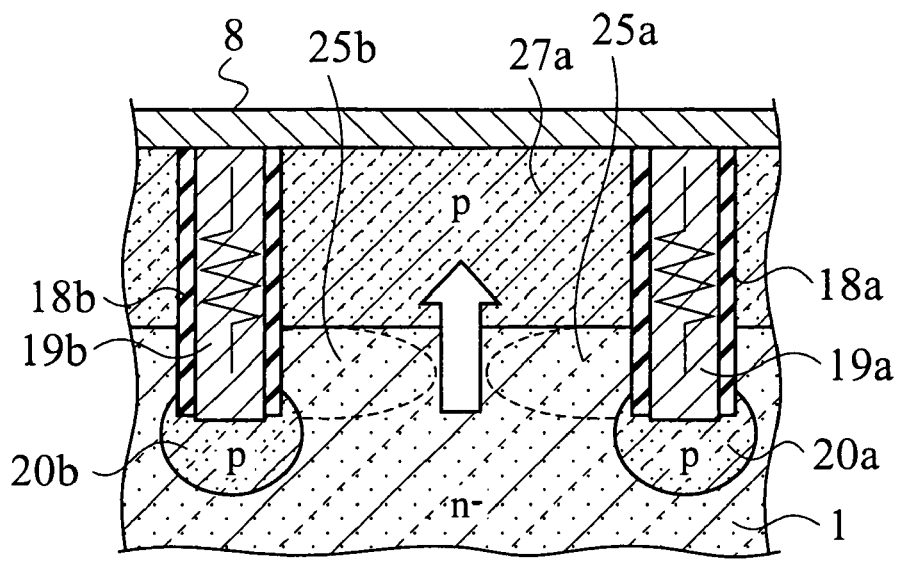
FIGS. 30A and 30B are cross-sectional views to explain the operation of the semiconductor power device in FIG. 27, with FIG. 30A showing a case wherein the current flowing in the conductive state is comparatively large, and FIG. 30B showing a case wherein the current flowing in the conductive state is comparatively small.

In the reverse recovery condition, a part of the holes accumulated in the base layer 1, i.e., a part of a reverse recovery current, flow to the anode electrode 8 through the sense regions 20a, 20b and 20c and the resistor regions 19a, 19b and 19c, respectively. Therefore, a potential difference occurs between both ends of the resistor regions 19a, 19b and 19c, that is to say, the potentials of the resistor regions 19a, 19b and 19c, near the sense regions 20a, 20b and 20c, are respectively raised relative to the potentials near the anode electrode 8. The resistor regions 19a, 19b and 19c, the control insulating regions 18a, 18b and 18c and the base layer 1 constitute a MOS structure. Then, as is shown in FIG. 30A, depletion layers 25a and 25b spread out beginning at the surface of the base layer 1 contacting the control insulating films 18a and 18b. The depletion layers 25a and 25b spread out perpendicular to the sides of the grooves. A current path from the base layer 1 to the anode region 27a is narrowed by the depletion layers 25a and 25b.

When the current flowing in the conductive state is comparatively large, the number of carriers accumulated in the base layer 1 is also increased, and the reverse recovery current is enhanced. Therefore, since the density of a current flowing across the resistor regions 19a and 19b is increased, as is shown in FIG. 30A, the depletion layers 25a and 25b are greatly extended. Thus, during the reverse recovery, the carriers accumulated in the base layer 1 are not suddenly injected into the anode region 27a, and the soft recovery characteristic, inherent to the reverse recovery, is improved.

Figure 30B:
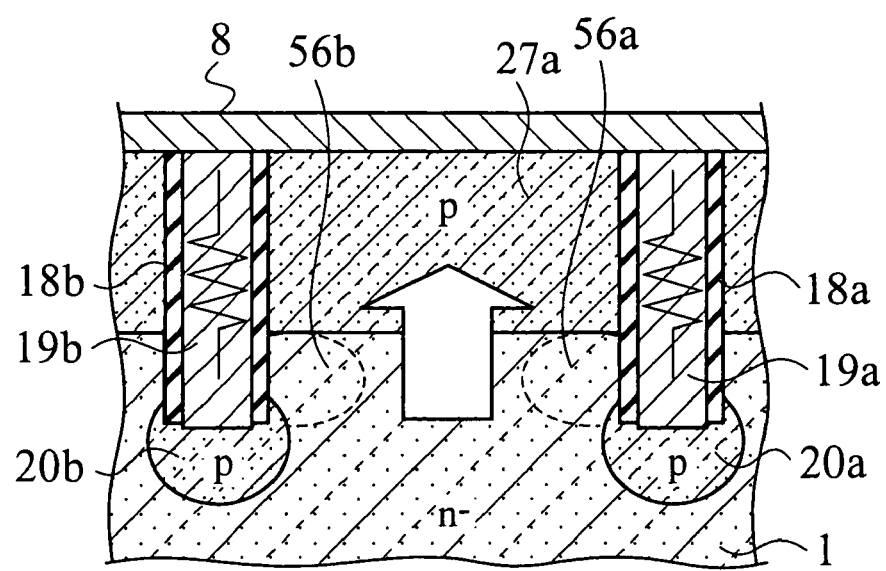

When the current flowing in the conductive state is comparatively small, the current flowing across the resistor regions 19a and 19b is also reduced, so that, as is shown in FIG. 30B, depletion layers 56a and 56b will not be greatly spread. As a result, current oscillation can be suppressed during the reverse recovery.

As is described above, when the current flowing in the conductive state is comparatively large, the softness of the reverse recovery operation is improved. When the current flowing in the conductive state is comparatively small, current oscillation can be suppressed during the reverse recovery.

A method for manufacturing the semiconductor power device in FIGS. 27 to 29 will now be described while referring to FIGS. 31A to 31c and FIGS. 32A to 32C. The cross sections shown in FIGS. 31A to 31C and FIGS. 32A to 32C correspond to the cross section taken along XXVIII—XXVIII in FIG. 29.

Figure 31A:
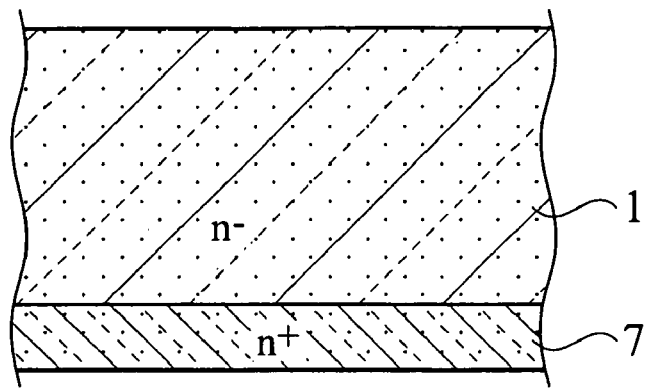
FIGS. 31A to 31C and FIGS. 32A to 32C are cross-sectional views of the main manufacturing processes of a method employed to produce the semiconductor power device in FIG. 27.

(A) First, n-type impurity ions, such as phosphorus (P) ions or arsenic (As) ions, are implanted from the first main surface of an n⁻-type semiconductor substrate. When an annealing process is performed in a nitrogen atmosphere, as is shown in FIG. 31A the n⁻-type base layer 1 and the n⁺-type cathode layer 7 are formed.

Figure 31B:
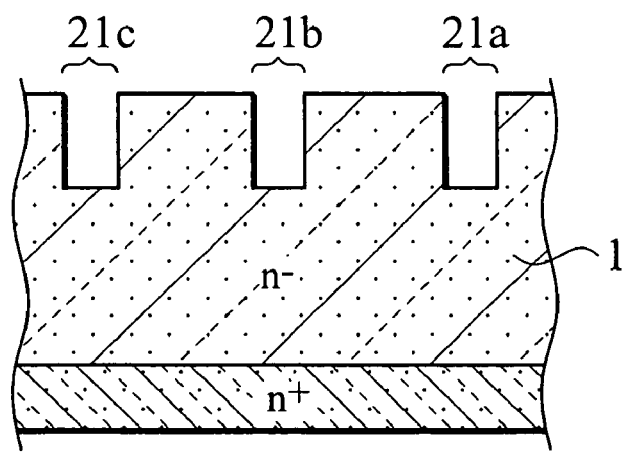

(B) By using photolithography and anisotropic etching, part of the base layer 1 is selectively removed from the second main surface of the n⁻-type semiconductor substrate opposite the first main surface. Thus, as is shown in FIG. 31B, grooves 21a, 21b and 21c that reach inside the base layer 1 to a specific depth are formed.

Figure 31C:
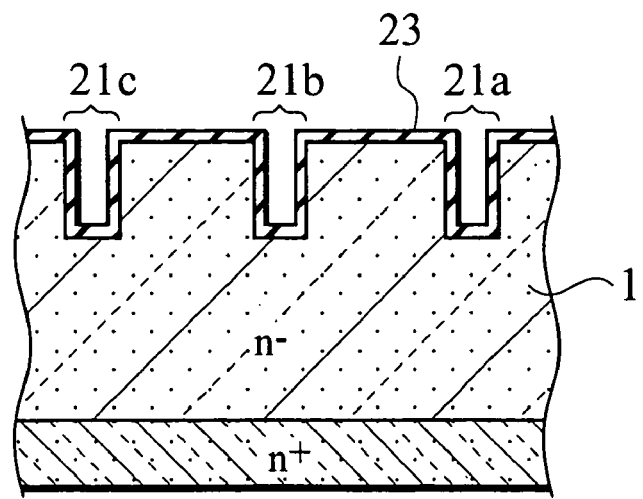

(C) As is shown in FIG. 31C, by using the CVD method or the thermal oxidation method, an insulating film 23 is deposited on the internal walls of the grooves 21a, 21b and 21c and on the second main surface of the semiconductor substrate. The thickness of the insulating film 23 is not limited so long as the grooves 21a, 21b and 21c are not filled.

Figure 32A:
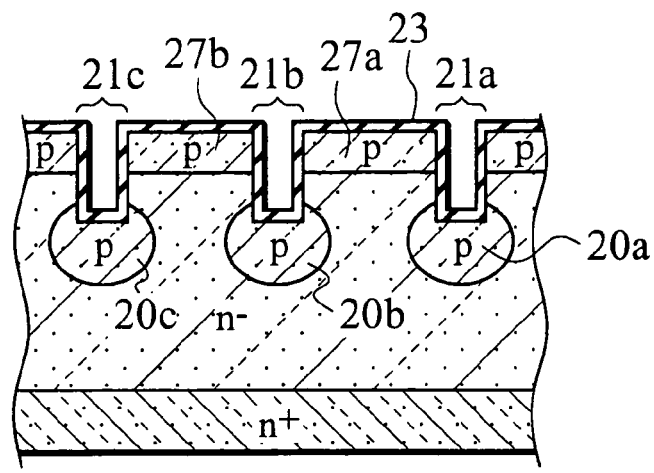

(D) By employing ion implantation, p-type impurity ions, such as boron (B) ions, are implanted from the second main surface of the semiconductor substrate. When an annealing process is performed in a nitrogen atmosphere, as is shown in FIG. 32A the anode regions 27a and 27b and the sense regions 20a, 20b and 20c are formed.

Figure 32B:
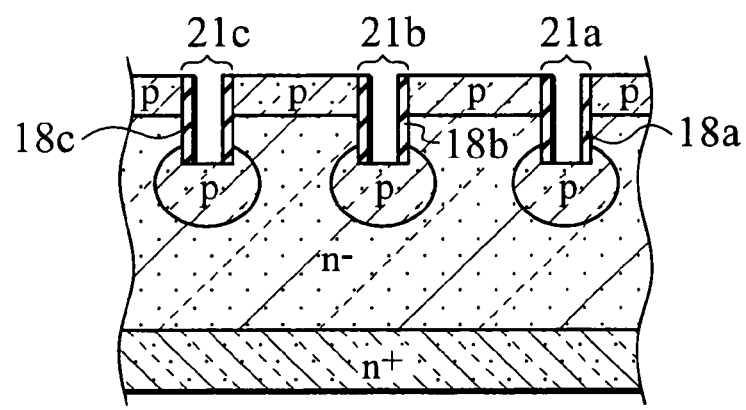

(E) By employing anisotropic etching, the insulating film 23 fabricated on the anode regions 27a and 27b and the sense regions 20a, 20b and 20c is selectively removed. Then, as is shown in FIG. 32B, the control insulating films 18a, 18b and 18c are respectively formed along the sides of the grooves 21a, 21b and 21c.

Figure 32C:
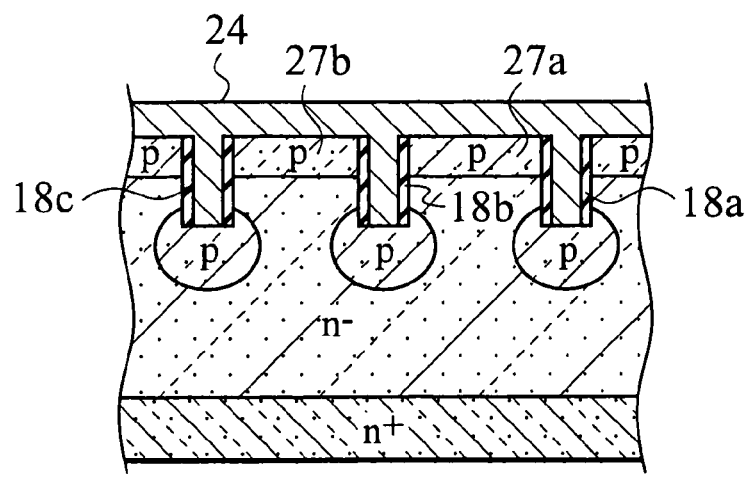

(F) By using the CVD method or sputtering, as is shown in FIG. 32C, a conductor film 24 is deposited on the second main surface of the semiconductor substrate until the insulating films 18a, 18b and 18c and the conductor film 24 fill the grooves 21a, 21b and 21c.

(G) Finally, by employing a planarization method, such as the CMP method, part of the conductor film 24 accumulated on the anode regions 27a and 27b is removed. The planarization process is terminated when the anode regions 27a and 27b are exposed by partially removing the conductor film 24. Through this manufacturing processing, the semiconductor power device in FIGS. 27 to 29 is completed.

As is described above, when the p-type impurity ions are implanted into the bottoms of the grooves 21a, 21b and 21c and the second main surface of the base layer 1, the anode regions 27a and 27b and the sense regions 20a, 20b and 20c are formed. At this time, since the insulating film 23 is formed on the sides of the grooves 21a, 21b and 21c, the p-type impurity ions are not implanted through the sides of the grooves 21a, 21b and 21c. While the same procedures are used to form the anode regions 27a and 27b and the sense regions 20a, 20b and 20c, different procedures may be employed to form the anode regions 27a and 27b and the sense regions 20a, 20b and 20c.

Modification of the Fifth Embodiment

Figure 33:
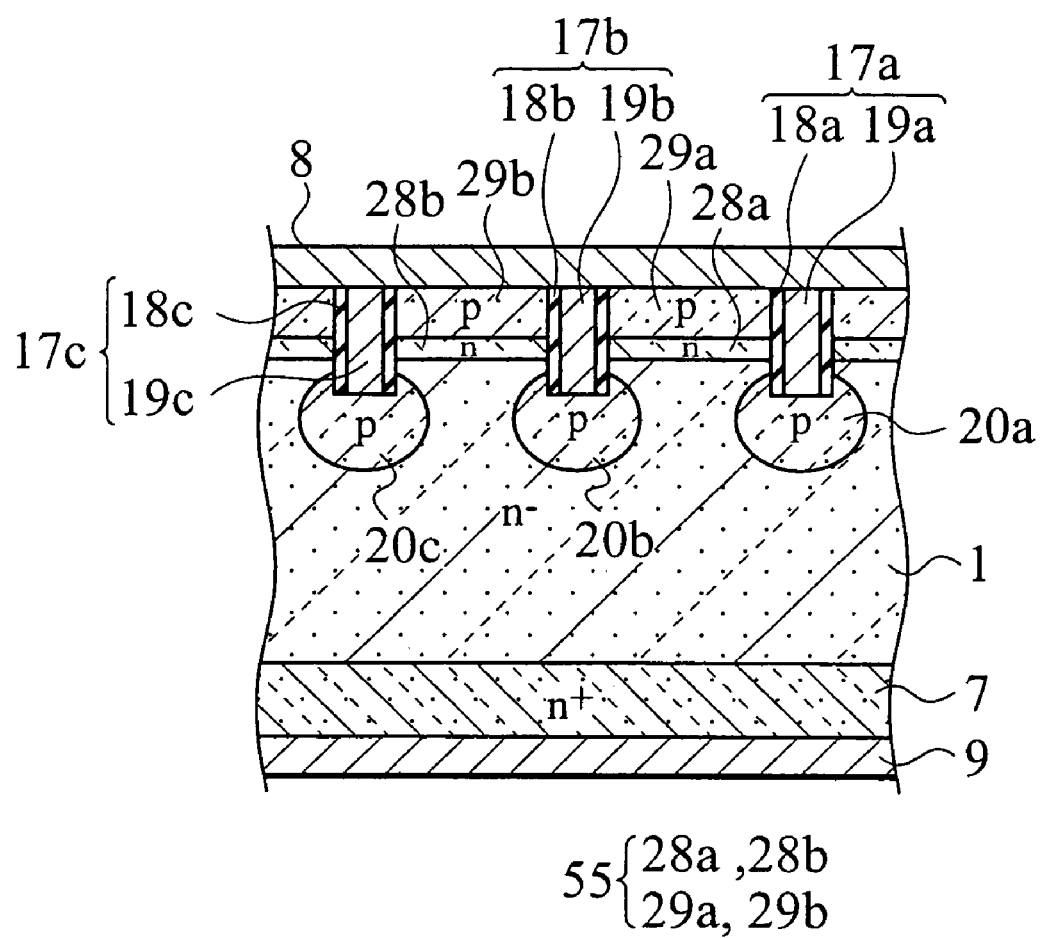
FIG. 33 is a cross-sectional view of a part of a semiconductor power device according to a modification of the fifth embodiment.

As is shown in FIG. 33, a semiconductor power device according to a modification of the fifth embodiment includes a base layer 1 which has a first main surface and a second main surface opposite the first main surface, an anode layer 55 connected to the first main surface of the base layer 1, control regions 17a, 17b and 17c arranged inside grooves that penetrate the anode layer 55 and reach inside the base layer 1, a cathode layer 7 connected to the second main surface of the base layer 1, sense regions 20a, 20b and 20c arranged in the base layer 1 and connected to the control regions 17a, 17b and 17c, an anode electrode 8 connected to the anode layer 55 and the control regions 17a, 17b and 17c, and a cathode layer 9 connected to the cathode layer 7. The anode layer 55 includes barrier layers 28a and 28b which contact the first main surface of the base layer 1, and anode regions 29a and 29b which are arranged on the barrier layers 28a and 28b. The control regions 17a, 17b and 17c respectively include control insulating films 18a, 18b and 18c arranged along the sides of the grooves, and resistor regions 19a, 19b and 19c located inside the control insulating films 18a, 18b and 18c. The resistor regions 19a, 19b and 19c are respectively connected to the sense regions 20a, 20b and 20c and to the anode electrode 8. A difference from the semiconductor power device in FIG. 28 is that the barrier layers 28a and 28b are located between the base layer 1 and the anode regions 29a and 29b.

According to the modification of the fifth embodiment, the number of holes injected into the base layer 1 from the anode regions 29a and 29b in the conductive state can be reduced, and the reverse recovery loss can be reduced. In the reverse recovery condition, the electric fields are concentrated near the bottoms of the control regions 17a, 17b and 17c. However, the bottoms of the control regions 17a, 17b and 17c are respectively protected by the sense regions 20a, 20b and 20c, and the blocking voltage is not reduced, even when the impurity concentrations of the barrier layers 28a and 28b are increased.

As another embodiment of the present invention, a diode used for a small signal can be implemented by using a part of the semiconductor power device according to one of the first to the fifth embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a base layer of a first conductivity type having a first main surface and a second main surface opposite the first main surface;
a first main electrode layer connected to the first main surface, the first main electrode layer including
barrier layers of a first conductivity type, configured to contact the first main surface, and having a higher impurity concentration than that of the base layer, and
first main electrode regions of a second conductivity type and arranged in the barrier layers;
control regions contacting the first main electrode regions and arranged inside grooves which penetrate the first main electrode layer and the base layer;

a second main electrode layer of the first conductivity type and connected to the second main surface; and a first main electrode connected to the first main electrode regions and Schottky-contacted to the barrier layers, wherein the barrier layers contact the control regions.

2. The semiconductor device of claim 1, wherein the control regions each comprise:

a control insulating film arranged along the sides and the bottom of each of the grooves; and a conductor region arranged on the control insulating film.

3. The semiconductor device of claim 2, wherein the conductor region is formed of polycrystalline silicon.

* * * * *